(12) United States Patent
Oh et al.

(10) Patent No.: US 9,691,833 B2
(45) Date of Patent: Jun. 27, 2017

(54) THIN FILM TRANSISTOR SUBSTRATE AND DISPLAY USING THE SAME

(71) Applicant: LG Display Co., Ltd., Seoul (KR)

(72) Inventors: Saeroonter Oh, Seoul (KR); Seungmin Lee, Seoul (KR); Juheyuck Baeck, Seoul (KR); Hoiyong Kwon, Busan (KR); Jeyong Jeon, Gyeonggi-do (KR); Dohyung Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/838,631

(22) Filed: Aug. 28, 2015

(65) Prior Publication Data

US 2016/0064465 A1    Mar. 3, 2016

Related U.S. Application Data

(60) Provisional application No. 62/043,449, filed on Aug. 29, 2014, provisional application No. 62/043,447, filed on Aug. 29, 2014, provisional application No. 62/043,470, filed on Aug. 29, 2014.

(30) Foreign Application Priority Data

Aug. 29, 2014 (KR) .................. 10-2014-0114302
Aug. 29, 2014 (KR) .................. 10-2014-0114305
Aug. 29, 2014 (KR) .................. 10-2014-0114307
Aug. 11, 2015 (KR) .................. 10-2015-0113281

(51) Int. Cl.
*H01L 29/10*    (2006.01)
*H01L 27/32*    (2006.01)
*H01L 29/786*   (2006.01)
*H01L 27/12*    (2006.01)

(52) U.S. Cl.
CPC ........ *H01L 27/3262* (2013.01); *H01L 27/124* (2013.01); *H01L 27/1222* (2013.01); *H01L 27/1251* (2013.01); *H01L 29/7869* (2013.01); *H01L 29/78675* (2013.01); *G09G 2300/0426* (2013.01)

(58) Field of Classification Search
CPC ............. H01L 27/3262; H01L 27/1222; H01L 27/124; H01L 27/1203; H01L 27/1259; H01L 27/1266; H01L 27/1225
USPC ......................................................... 257/43
See application file for complete search history.

(56) References Cited

U.S. PATENT DOCUMENTS

| | | |
|---|---|---|
| 9,129,927 B2 | 9/2015 | Gupta et al. |
| 2009/0283763 A1* | 11/2009 | Park ................. H01L 29/78621 257/43 |
| 2010/0181574 A1* | 7/2010 | Liu ..................... H01L 27/1229 257/72 |
| 2013/0257699 A1* | 10/2013 | Yamazaki ............ G11C 19/28 345/84 |
| 2015/0054799 A1 | 2/2015 | Chang et al. |
| 2015/0055047 A1 | 2/2015 | Chang et al. |
| 2015/0055051 A1 | 2/2015 | Osawa et al. |
| 2015/0236079 A1 | 8/2015 | Choi |

* cited by examiner

*Primary Examiner* — Brook Kebede
(74) *Attorney, Agent, or Firm* — Morgan, Lewis & Bockius LLP

(57) ABSTRACT

The present invention relates to a thin film transistor substrate having two different types of semiconductor materials on the same substrate, and a display using the same. A disclosed display may include a substrate, a first thin film transistor having a polycrystalline semiconductor material on the substrate and a second thin film transistor having an oxide semiconductor material on the substrate.

27 Claims, 14 Drawing Sheets

THIN FILM TRANSISTOR SUBSTRATE AND DISPLAY USING THE SAME

This application claims the benefit of Korea Patent Application Nos. 10-2014-0114302 filed on Aug. 29, 2014, 10-2014-0114305 filed on Aug. 29, 2014, 10-2014-0114307 filed on Aug. 29, 2014, and 10-2015-0113281 filed on Aug. 11, 2015, and the U.S. Provisional Patent Application Nos. 62/043,449 field on Aug. 29, 2014, 62/043,447 field on Aug. 29, 2014, and 62/043,470 filed on Aug. 29, 2014, which are each incorporated herein by reference for all purposes as if fully set forth herein.

BACKGROUND OF THE INVENTION

Field of the Invention

The present invention relates to a thin film transistor substrate, and more particularly, to a thin film transistor substrate having two different types of semiconductor materials on the same substrate, and a display using the same.

Discussion of the Related Art

As the information society continues to develop, displays for depicting information are increasingly required in various ways to do more. Accordingly, various flat panel displays (or 'FPDs') are developed for overcoming many drawbacks of the cathode ray tube (or 'CRT'), such as heavy weight and large volume. The flat panel displays include liquid crystal displays (or 'LCDs'), plasma display panels (or 'PDPs'), the organic light emitting displays (or 'OLEDs') and electrophoresis displays (or 'EDs').

The display panel of a flat panel display may include a thin film transistor substrate having a thin film transistor in each pixel region arranged in a matrix format. For example, a liquid crystal display (or 'LCD') displays video data by controlling the light transitivity of the liquid crystal layer using the electric fields applied across the liquid crystal layer. An organic light emitting diode display displays the video data by generating properly controlled light at each pixel disposed in a matrix manner as an organic light emitting diode is formed therein.

As a self-emitting display device, the organic light emitting diode display has the advantages of a fast response time, high brightness and a large viewing angle. An organic light emitting diode display (or OLED) using organic light emitting diodes of a high energy efficiency can be categorized as a passive matrix type organic light emitting diode display (or PMOLED) or an active matrix type organic light emitting diode display (or AMOLED).

As the development of personal electronic devices is becoming more active, display devices are being developed as highly portable and/or wearable devices. To incorporate a display device into a portable and/or wearable device, it is typically desirable for the display device to have low power consumption. However, with the conventional display technologies that have been developed to date, there are limitations on reducing power consumption.

SUMMARY OF THE INVENTION

Accordingly, the present invention relates to a thin film transistor substrate and a display using the same that substantially obviate one or more of the problems due to limitations and disadvantages of the related art.

An object of the present invention is to provide a thin film transistor substrate for a flat panel display having at least two different types of transistors with different characteristics on the same substrate.

Another object of the present invention is to provide a thin film transistor substrate for a flat panel display having two different types of transistors manufactured by improved manufacturing processes and a reduced number of mask processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device includes: a substrate; a first gate insulating layer over the substrate; a first thin film transistor including a first semiconductor layer including the polycrystalline semiconductor material on the substrate, and having a middle portion and two side portions, a first source area and a first drain area, each including the oxide semiconductor material and disposed on a respective one of the side portions of the first semiconductor layer, and a first gate electrode disposed on the first gate insulating layer and overlapping the middle portion of the first semiconductor layer; and a second thin film transistor having an oxide semiconductor material on the substrate.

In another aspect, a display device includes: a substrate; a first thin film transistor on the substrate, and including a source electrode and a first semiconductor layer having a polycrystalline semiconductor material; and a second thin film transistor on the substrate, and including a drain electrode, and a second semiconductor layer having an oxide semiconductor material, wherein the source electrode and the drain electrode are made of a same material and are disposed at a same layer level.

In yet another aspect, a display device includes: a substrate; a first thin film transistor on the substrate, and including a first semiconductor layer having a polycrystalline semiconductor material; a second thin film transistor on the base substrate, and including a second semiconductor layer; and an oxide semiconductor layer connecting the first semiconductor layer and the second semiconductor layer.

The thin film transistor substrate and a display using the same according to the present invention comprises two different types of thin film transistors on the same substrate, so that these two different types of thin film transistors can compensated for and complement each other. In particular, by including a thin film transistor having the low off-current characteristics, the display can have the low frequency driving property and the low power consumption property. Therefore, it is suitable for use in the portable and/or wearable appliances.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings.

DETAILED DESCRIPTION OF THE ILLUSTRATED EMBODIMENTS

Figure 1:
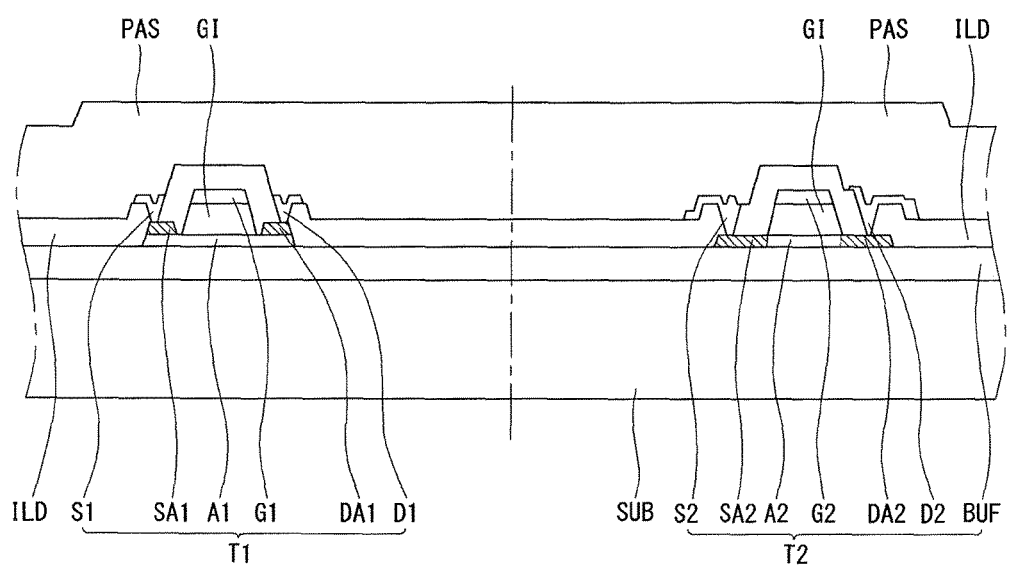
FIG. 1 is a cross sectional view illustrating a structure of a thin film transistor substrate for a flat panel display in which two different types of thin film transistors are formed, according to the first example embodiment of the present invention.

Reference will now be made in detail to the example embodiments of the present invention, which are illustrated in the accompanying drawings. Like reference numerals designate like elements throughout the detailed description. However, the present invention is not restricted by these example embodiments but various changes or modifications can be made without departing from the principle or spirit of the invention. In the following example embodiments, the names of the elements are selected for ease of explanation and may be different from names used in actual products.

As used herein, unless otherwise specified, the term "on" broadly encompasses both "directly on" and "indirectly on". Also, unless otherwise specified, the term "under" broadly encompasses both "directly under" and "indirectly under".

The thin film transistor substrate for a flat panel display according to example embodiments of the present invention may comprise a first thin film transistor disposed in a first area of the substrate and a second thin film transistor disposed in a second area of the same substrate. The substrate may include a display area and a non-display area. In the display area, a plurality of pixel areas is arranged in a matrix format. In a pixel area, display elements for implementing a display function are disposed. In the non-display area neighboring the display area, driver elements for driving the display elements in the display area are disposed.

Here, the first area may be the non-display area, and the second area may be some or all portions of the display area. In this example, the first thin film transistor and the second thin film transistor may be disposed substantially apart from each other. In another example, the first area and the second area may both be included in the display area. In particular, in an example where a plurality of thin film transistors are disposed in one pixel area, the first thin film transistor and the second thin film transistor may be disposed near each other.

As the polycrystalline semiconductor material has the characteristics of high mobility (over 100 $cm^2/Vs$), low power consumption, and high reliability, it may be suitable for use in the thin film transistors in such driver elements as a gate driver and/or a multiplexer (or 'MUX') for driving the display elements. In addition, it may be suitable for use in a driving thin film transistor disposed in the pixel area of an organic light emitting diode display. On the other hand, as the oxide semiconductor material has low off-current, it may be suitable for use in the channel layer of a switching thin film transistor in the pixel area, which typically has a very short ON time period and a long OFF time period. Further, as the off-current is low, the holding time of the pixel voltage may be long. Thus, thin film transistors using the oxide semiconductor material is suitable for use in a display requiring low frequency driving and/or low power consumption. By disposing these two different types of thin film transistors on the same base substrate, the present invention provides a thin film transistor substrate having an optimized function and characteristic for the portable and/or wearable displays.

When a semiconductor layer is formed using the polycrystalline semiconductor material, a doping process and a high temperature treatment process are required. On the other hand, a process for forming a semiconductor layer using the oxide semiconductor material is typically performed at relatively low temperatures. Therefore, the polycrystalline semiconductor layer, typically formed under a more severe heat condition, may be formed first, and then the oxide semiconductor layer may be formed. Further, to simplify the manufacturing process, the first thin film transistor having the polycrystalline semiconductor material and the second thin film transistor having the oxide semiconductor material may have the same basic structure. For example, the first gate electrode of the first thin film transistor and the second gate electrode of the second thin film transistor may be formed from the same layer of the same metal material. In addition, the first source and drain electrodes of the first thin film transistor, and the second source and drain electrodes of the second thin film transistor may be made from the same layer of the same metal material. Further, to maintain consistent characteristics of these two different semiconductor materials, both the first and second thin film transistors may have the top-gate structure in which the channel area can be defined relatively precisely.

For ease of reference hereinafter, unless otherwise specified, the first thin film transistor refers to a thin film transistor having a polycrystalline semiconductor material, and the second thin film transistor a thin film transistor having an oxide semiconductor material. For example, the first thin film transistor may be used in the driver elements disposed in the non-display area, and the second thin film transistor may be used in the display elements disposed in the pixel areas of the display area. However, the references to the first and second thin film transistors are not restricted to the above example only. In an example of the organic light emitting diode display, the first thin film transistor and the second thin film transistor may both be disposed in a pixel area of the display area. In particular, the first thin film transistor having the polycrystalline semiconductor material may be used as the driving thin film transistor, and the second thin film transistor having the oxide semiconductor material may be used the switching thin film transistor.

Moreover, when a gate driving circuit (or, a gate driver) is disposed within the non-display area of the substrate, the gate driver may include C-MOS type thin film transistors having the polycrystalline semiconductor material. In other words, P-MOS type thin film transistors and N-MOS type thin film transistors both having the poly crystalline semiconductor layers may be incorporated in the gate driver disposed in the non-display area. In that case, in order to form a low density doping area (or an LDD area) for the N-MOS type thin film transistors, many mask processes may be required. Here, the N-MOS type thin film transistor having the poly crystalline semiconductor material may be replaced with a thin film transistor having an oxide semiconductor material so that the LDD area may not be required, and the number of mask processes can be simplified and/or reduced.

First Example Embodiment

The first example embodiment of the present invention is discussed with reference to FIG. 1. FIG. 1 is a cross sectional view illustrating a structure of a thin film transistor substrate for a flat panel display in which two different types of thin film transistors are formed, according to the first example embodiment of the present invention. Here, the cross sectional views are more often referenced mainly because they more clearly show features of the example embodiments of the present invention than plane views.

As shown in FIG. 1, the thin film transistor substrate for a flat panel display according to the first example embodiment comprises a first thin film transistor T1 and a second thin film transistor T2, which are disposed on the same base substrate SUB. The base substrate SUB may hereinafter be referred to as the substrate SUB or the substrate. The first and second thin film transistors T1 and T2 may be disposed substantially far apart from each other, or they may be disposed near each other. Moreover, these two thin film transistors may be disposed as to overlap each other.

On the whole surface of the substrate SUB, a buffer layer BUF may be deposited. In some cases, the buffer layer BUF may not be included. Further, the buffer layer BUF may include a plurality of layers. Here, for ease of reference, the buffer layer BUF is referred to as a single layer. Further, a light shield layer may be included between the substrate SUB and the buffer layer BUF at some areas on the substrate SUB. The light shield layer may be further disposed to prevent light from entering into the semiconductor layer of the thin film transistors disposed thereon.

On the buffer layer BUF, a first semiconductor layer is disposed where the first thin film transistor T1 is located. For examples where the first thin film transistor T1 is used in driver elements, the semiconductor layer may have characteristics of high switching speed and lower power consumption. For example, a P-MOS type or N-MOS type thin film transistor may be used, or a C-MOS type transistor may be used for the first thin film transistor T1. The P-MOS, N-MOS and/or C-MOS type thin film transistor may have a polycrystalline semiconductor material, such as polycrystalline silicon (p-Si). The first semiconductor layer includes a first channel area A1 of the first thin film transistor T1. The first channel area A1 may be defined as the area of the first semiconductor layer overlapped by the first gate electrode G1. As the first gate electrode G1 overlaps the middle portions of the first semiconductor layer, the middle portions of the first semiconductor layer may be defined as the first channel area A1.

Further, on the buffer layer BUF, a second semiconductor layer is disposed where the second thin film transistor T2 is located. The second semiconductor layer includes the second channel area A2 of the second thin film transistor T2. For example, the second semiconductor layer may include an oxide semiconductor material, such as an indium gallium zinc oxide (or "IGZO"), an indium gallium oxide (or "IGO"), or an indium zinc oxide (or "IZO"). The oxide semiconductor material has a relatively low off-current such that the pixels may hold the pixel voltage for long periods. Thus, thin film transistors with oxide semiconductor materials are suitable for displays requiring low frequency driving and/or low power consumption.

The second semiconductor layer comprises the second channel area A2 included into the second thin film transistor T2. The second channel area A2 may be defined as the area of the second semiconductor layer under the second gate electrode G2. As the second gate electrode G2 overlaps the middle portion of the second semiconductor layer, the middle portion of the second semiconductor layer may be defined the second channel area A2.

The first semiconductor layer has the polycrystalline semiconductor material, and the second semiconductor layer has the oxide semiconductor material. The process for forming the polycrystalline semiconductor layer requires a higher temperature environment than that for forming the oxide semiconductor layer. Therefore, the polycrystalline semiconductor layer may be formed first and then the oxide semiconductor layer may be formed. In addition, the portions of the second semiconductor layer at both sides of the second channel area A2 may be made conductive and defined as the second source area SA2 and the second drain area DA2, respectively. Using these manufacturing characteristics, the first source area SA1 and the first drain area DA1 may be formed with the oxide semiconductor material made conductive on the both side portions of the poly crystalline semiconductor layer.

The first channel area A1 and the second channel area A2 respectively overlap with the first gate electrode G1 and the second gate electrode G2, with the gate insulating layer GI respebetween. After the first gate electrode G1 and the second gate electrode G2 are formed, an intermediate insulating layer ILD is deposited over the whole surface of the substrate SUB. On the intermediate insulating layer ILD, the first source electrode S1, the first drain electrode D1, the second source electrode S2 and the second drain electrode D2 are disposed.

The first source electrode S1 and the first drain electrode D1 are connected to the first source area SA1 and the first drain area DA1, respectively, via respective contact holes through the intermediate insulating layer ILD. The second source electrode S2 and the second drain electrode D2 are connected to the second source area SA2 and the second drain area DA2, respectively, via respective contact holes through the intermediate insulating layer ILD.

Then, on the whole surface of the substrate SUB having the first thin film transistor T1 and the second thin film transistor T2, a passivation layer PAS is deposited. Further, by patterning the passivation layer PAS, contact holes for exposing the first drain electrode D1 and/or the second drain electrode D2 may be included. In addition, on the passivation layer PAS, a pixel electrode (or an anode electrode for the organic light emitting diode display) may be included as connecting to the first drain electrode D1 and/or second drain electrode D2. Here, for convenience, only the respective structures of the first and second thin film transistors T1 and T2 are illustrated.

When two different types of thin film transistors having different characteristics on the same substrate, the polycrystalline semiconductor layer may be formed first and then the oxide semiconductor layer may be formed so that the characteristics of both types of semiconductor layers can be better maintained. By forming two different semiconductor layers in separated processes, it is possible to form two different types of thin film transistors with the similar basic structure on the same substrate. Therefore, most of the respective components of the first thin film transistor T1 and the second thin film transistor T2 can be formed from the same layer with the same material.

Figure 2:
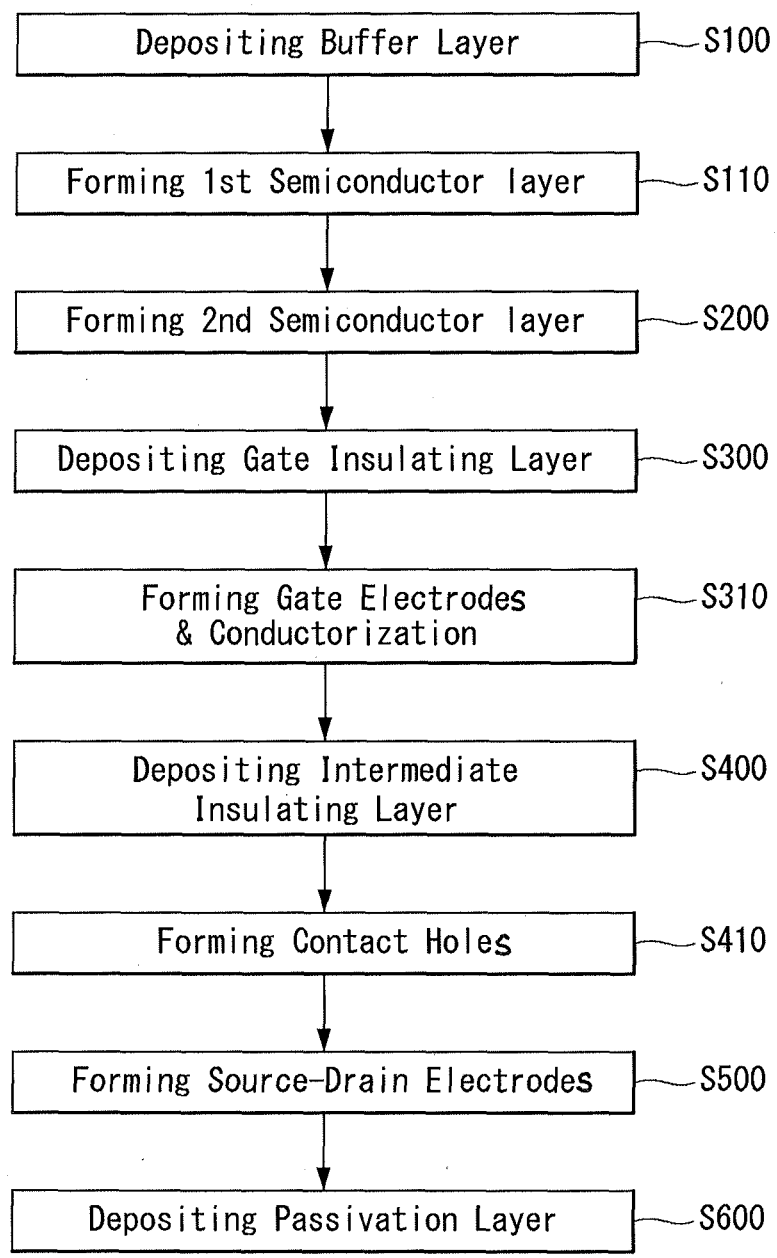
FIG. 2 is a flow chart illustrating a method for manufacturing the thin film transistor substrate for a flat panel display in which two different types of thin film transistors are formed, according to the first example embodiment of the present invention.

Hereinafter, with reference to FIG. 2, the manufacturing method for the thin film transistor substrate of the flat panel display including two different types of thin film transistors on the same substrate is discussed. FIG. 2 is a flow chart illustrating a method for manufacturing a thin film transistor substrate having two different types of thin film transistors according to the first example embodiment of the present invention.

In step S100, on a substrate SUB, a buffer layer BUF is deposited. Even though it is not shown in figures, before depositing the buffer layer BUF, a light shield layer may be formed on the substrate SUB at desired areas.

In step S110, on the buffer layer BUF, an amorphous silicon (a-Si) material is deposited. A crystallization process is performed to convert the amorphous silicon material into a polycrystalline silicon (poly-Si) material. With a first mask process, the polycrystalline silicon material is patterned to form a first semiconductor layer. In some cases, using the hydrogenation process results in filling many vacancies existing in the polycrystalline semiconductor material with the hydrogen particles so that the characteristics of the semiconductor material can be stabilized and/or enhanced.

In step S200, on the buffer layer BUF having the first semiconductor layer thereon, a metal oxide semiconductor material is deposited. With a second mask process, the oxide semiconductor material is patterned to form a second semiconductor layer. Here, the second semiconductor layer is also formed on the first semiconductor layer, at the both side portions of the first channel area A1.

In step S300, an insulating material is deposited on the whole surface of the substrate SUB having the first semiconductor layer and the second semiconductor layer to form a gate insulating layer GI. The gate insulating layer GI may include a silicon oxide. Further, the gate insulating layer GI may have a thickness of 1,000 Å or more and 2,000 Å or less.

In step S310, on the gate insulating layer G1, a gate metal material is deposited. With a third mask process, the gate metal layer is patterned to form the gate electrodes. In particular, a first gate electrode G1 for the first thin film transistor T1 and a second gate electrode G2 for the second thin film transistor T2 are formed at the same time with the third mask process. The first gate electrode G1 is disposed to overlap with the first channel area A1, the middle portion of the first semiconductor layer. The second gate electrode G2 is disposed to overlap with the second channel area A2, the middle portion of the second semiconductor layer. In the third mask process for forming the first gate electrode G1 and the second gate electrode G2, the gate insulating layer GI is also patterned as having substantially the same shape as the first and the second gate electrodes G1 and G2. In this process, the portions of the second semiconductor layer formed on the first semiconductor layer and exposed at both sides of the first gate electrode G1 are made conductive so that these portions are defined as the first source area SA1 and the first drain area DA1, respectively. A conductorization process, as used herein, refers to any known process for making an oxide semiconductor material conductive. Likewise, the exposed portions of the second semiconductor layer at both sides of the second gate electrode G2 are also made conductive so that these portions are defined as the second source area SA2 and the second drain area DA2, respectively.

In step S400, on the whole surface of the substrate SUB having the first gate electrode G1 and the second gate electrode G2, an intermediate insulating layer ILD is deposited. The intermediate insulating layer ILD may include a nitride layer and/or an oxide layer. In view of the manufacturing process, the total thickness of the intermediate insulating layer ILD may have a thickness between 2,000 Å and 6,000 Å.

In step S410, with a fourth mask process, the intermediate insulating layer ILD is patterned to form the contact holes for exposing the first source area SA1 and the first drain area DA1, and the second source area SA2 and the second drain area DA2. These contact holes are for connecting the source and drain electrodes to the source and drain areas in a subsequent process.

In step S500, a source-drain metal material is deposited on the intermediate layer ILD having the contact holes. With a fifth mask process, the source-drain metal material is patterned to form a first source electrode S1, a first drain electrode D1, a second source electrode S2 and a second drain electrode D2. The first source electrode S1 contacts the first source area SA1. The first drain electrode D1 contacts the first drain area DA1. The second source electrode S2 contacts the second source area SA2. The second drain electrode D2 contacts the second drain area DA2.

In step S600, on the whole surface of the substrate SUB having the source and drain electrodes, a passivation layer PAS is deposited. Even though not shown in the figures, the passivation layer PAS may be patterned to form contact holes for exposing portions of the first and/or second drain electrodes D1 and/or D2.

In the first example embodiment of the present invention, the first gate electrode G1 and the second gate electrode G2 are formed from the same layer with the same material. During the patterning process for the first and the second gate electrodes G1 and G2, exposed portions of the oxide semiconductor material, e.g., the portions of the second semiconductor layer not overlapped by the first and second gate electrodes G1 and G2, are made conductive. For the polycrystalline semiconductor layer, the channel area is typically defined by a doping process. In the first example embodiment, however, a doping process is not necessary. By forming the oxide semiconductor material, e.g., the second semiconductor layer, on the polycrystalline semiconductor layer, e.g., the first semiconductor layer, and treating the oxide semiconductor material to become conductive, the channel area, and the source and drain areas may be defined. Therefore, the two different types of thin film transistors with substantially the same basic structure may be formed.

Second Example Embodiment

Figure 3:
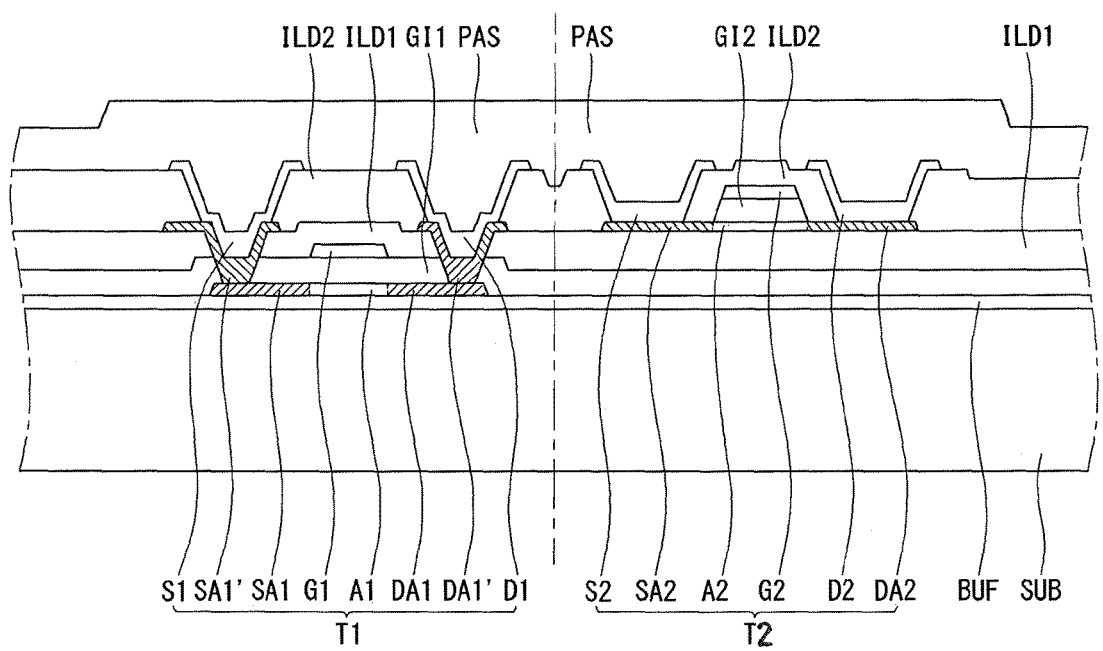
FIG. 3 is a cross sectional view illustrating a structure of a thin film transistor substrate for a flat panel display in which two different types of thin film transistors are formed, according to the second example embodiment of the present invention.

The second example embodiment of the present invention is discussed herebelow with reference to FIG. 3. FIG. 3 is a cross sectional view illustrating a structure of a thin film transistor substrate for a flat panel display in which two different types of thin film transistors are formed, according to the second example embodiment of the present invention.

In the first example embodiment, on the both side portions of the channel area in the polycrystalline semiconductor layer, the oxide semiconductor layer is formed and treated to become conductive to define the channel area. That is, the polycrystalline semiconductor layer does not have a doped area. Therefore, in some cases, there may be a potential issue of a relatively high resistance at the connection between the polycrystalline semiconductor layer and the source or drain electrode as it may lack an ohmic contact.

The second example embodiment provides a structure of the thin film transistor substrate having two different types of thin film transistors and addressing the above possible issue with the first example embodiment. As shown in FIG. 3, the thin film transistor substrate according to the second example embodiment of the present disclosure includes a first thin film transistor T1 and the second thin film transistor T2 disposed on the same base substrate SUB. The first and second thin film transistors T1 and T2 may be disposed substantially far apart far from each other, or they may be disposed near each other. These two thin film transistors may also be disposed as overlapping each other.

In the second example embodiment, the first thin film transistor T1 is formed first, and then the second thin film transistor T2 is formed. To simplify the manufacturing process, the source and drain electrodes for both thin film transistors T1 and T2 are formed from the same layer of the same material. In this example, the second thin film transistor T2 is separated from the first thin film transistor T1 in the vertical direction. The source and drain electrodes of the first thin film transistor may not be directly connected to the source and drain areas of the thin film transistor due to a vertical separation between the source and drain electrodes, and the source and drain areas. Thus, by using an oxide semiconductor material of the second thin film transistor that is treated to become conductive, an ohmic contact can be provided.

As shown in FIG. 3, on the whole surface of the base substrate SUB, a buffer layer BUF is deposited. The buffer layer BUF may have the same structure as explained above in the first example embodiment and is not discussed in detail again. Similarly, the elements having the same structure as those of the example embodiment discussed above are not explained again in detail.

On the buffer layer BUF, a first semiconductor layer is disposed where the first thin film transistor T1 is located. The first semiconductor layer includes a first channel area A1 of the first thin film transistor T1. The first channel area A1 may be defined as the area of the first semiconductor layer overlapped by the first gate electrode G1. As the first gate electrode G1 overlaps the middle portions of the first semiconductor layer, the middle portions of the first semiconductor layer may be defined as the first channel area A1. The areas of the first semiconductor layer at both sides of the first channel area A1 are the impurity doped areas. These areas may be defined as a first source area SA1 and a first drain area DA1.

On the whole surface of the substrate SUB having the first semiconductor layer, a first gate insulating layer GI1 is formed. The first gate insulating layer GI1 may include an oxide insulating material such as the silicon oxide (SiOx). In view of the stability and the characteristics of the element, the first gate insulating layer GI1 may have a thickness between 1,000 Å and 2,000 Å.

On the first gate insulating layer GI1, the first gate electrode G1 is disposed. The first gate electrode G1 overlaps with the middle portion of the first semiconductor layer. The first semiconductor layer is doped with impurity material using the first gate electrode G1 as a doping mask. Then, the area of the first semiconductor layer overlapped by the first gate electrode G1 may be defined as first channel area A1. The impurity doped areas of the first semiconductor layer at both sides of the first channel area A1 may be defined as the first source area SA1 and the first drain area DA1, respectively.

A first intermediate insulating layer ILD1 is stacked on the whole surface of the substrate SUB including the first gate electrode G1. The first intermediate insulating layer ILD1 may have a multiple layer structure in which nitride layers including the nitride silicon (SiNx) material and oxide layers including the oxide silicon (SiOx) material are alternatively stacked. A nitride layer may be disposed close to the poly crystalline semiconductor layer. Therefore, a nitride layer may be stacked as a lower layer on an underlying layer (e.g., the gate electrode G1) and an oxide layer may be stacked as an upper layer on the nitride layer. The nitride layer may provide for conducting a hydrogenation process to the first semiconductor layer including the polycrystalline semiconductor material, in which a plurality of hydrogen particles are diffused into the polycrystalline semiconductor layer by a post thermal process. The oxide layer may prevent a significant amount of the hydrogen particles from being diffused into the oxide semiconductor material of the second thin film transistor T2.

In view of the manufacturing processes, the total thickness of the first intermediate insulating layer ILD1 may be between 2,000 Å and 6,000 Å. Therefore, if the first intermediate insulating layer ILD1 consists of one nitride layer and one oxide layer, for example, the thickness of each of the nitride layer and the oxide layer may be between 1,000 Å and 3,000 Å. Further, in order that the hydrogen particles can be more easily diffused into the first semiconductor layer from the nitride layer but not diffused into the second semiconductor layer so much, the thickness of the oxide layer may be thicker than that of the first gate insulating layer GI1. Moreover, as the oxide layer serves to prevent a significant amount of the hydrogen particles from being diffused into the second semiconductor layer from the nitride layer, the oxide layer may be thicker than the nitride layer.

On the first intermediate insulating layer ILD1, a second semiconductor layer is disposed. The second semiconductor layer has a second channel area A2 of the second thin film transistor T2. If the second thin film transistor T2 is for the display area, it may include the oxide semiconductor material.

With the same material of the second semiconductor layer, a first sub-source area SA1' and a first sub-drain area DA1' are disposed on the first source area SA1 and the first drain area DA1 of the first semiconductor layer, respectively. The first sub-source area SA1' is connected to the first source area SA1 exposed via a contact hole penetrating the first intermediate insulating layer ILD1 and the first gate insulating layer GI1. The first sub-drain area DA1' is connected to the first drain area DA1 exposed via another contact hole penetrating the first intermediate insulating layer ILD1 and the first gate insulating layer GI1.

The second semiconductor layer has the second channel area A2 included into the second thin film transistor T2. The second channel area A2 may be defined as the area of the second semiconductor layer overlapped by the second gate electrode G2. As the second gate electrode G2 overlaps the middle portion of the second semiconductor layer, the middle portion of the second semiconductor layer may be defined as the second channel area A2. The portions of the second semiconductor layer at both sides of the middle portion are treated to become conductive and may be defined respectively as the second source area SA2 and the second drain area DA2.

The second gate electrode G2 overlaps the second channel area A2 with the second gate insulating layer GI2 therebetween. In particular, the second gate insulating layer GI2 is patterned to have substantially the same shape and size as the second gate electrode G2. As a result of the patterning process, the areas of the oxide semiconductor material not covered by the second gate electrode G2 are treated to become conductive. For example, the second source area SA2, the second drain area DA2, the first sub-source area SA1' and the first sub-drain area DA1' include the conductive oxide semiconductor material.

On the second gate electrode G2, the second intermediate insulating layer ILD2 is stacked over the whole surface of the substrate SUB. On the upper surface of the second intermediate insulating layer ILD2, the source and drain electrodes are disposed. For example, the first source electrode S1 and the first drain electrode D1 of the first thin film transistor T1, and the second source electrode S2 and the second drain electrode D2 of the second thin film transistor T2 are disposed on the second intermediate insulating layer ILD2. The first source electrode S1 is connected to the first sub-source area SA1' and the first drain electrode D1 is connected to the first sub-drain area DA1'. Further, the second source electrode S2 is connected to the second source area SA2 and the second drain electrode D2 is connected to the second drain area DA2.

On the source and drain electrodes, a passivation layer PAS is deposited over the whole surface of the substrate SUB. When forming two different types of thin film transistors having different characteristics on the same substrate, the polycrystalline semiconductor layer may be formed first and then the oxide semiconductor layer may be formed so that the characteristics of both types of the semiconductor layers can be better maintained. In comparison with the first embodiment, the gate electrodes are formed from different layers so that the manufacturing process may be more complicated than that of the first embodiment. However, because the polycrystalline semiconductor layer is disposed further away in a vertical direction from the oxide semiconductor layer, the respective characteristics of these two different elements can be more stabilized.

Figure 4:
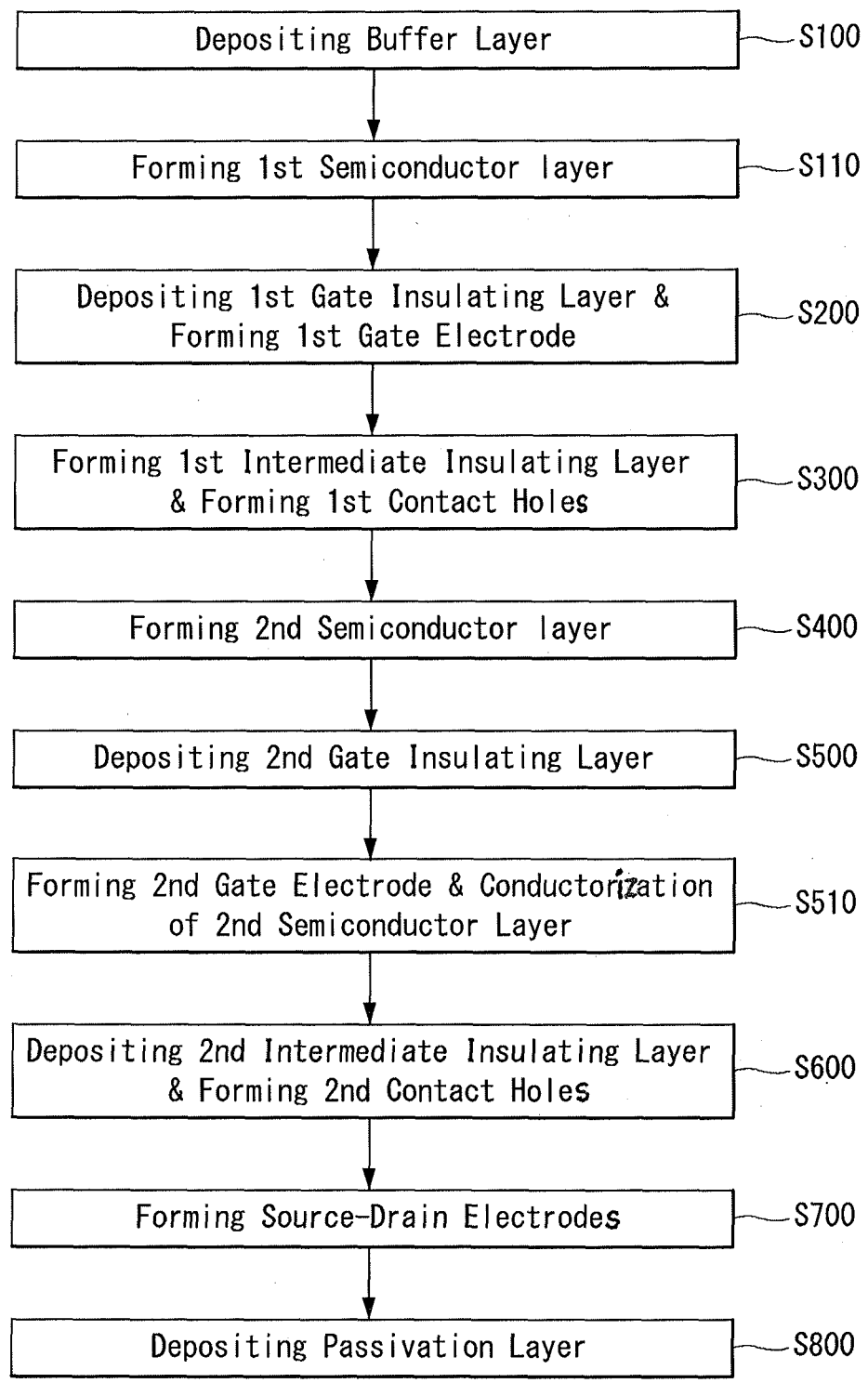
FIG. 4 is a flow chart illustrating a method for manufacturing the thin film transistor substrate for a flat panel display in which two different types of thin film transistors are formed, according to the second example embodiment of the present invention.

Hereinafter, the method for manufacturing the thin film transistor substrate for a flat panel display according to the second example embodiment of the present invention is discussed with reference to FIG. 4. Here, to the extent that similar features are already discussed above, they may not be repeated below. FIG. 4 is a flow chart illustrating a method for manufacturing the thin film transistor substrate for a flat panel display in which two different types of thin film transistors are formed, according to the second example embodiment of the present invention.

In step S100, on a base substrate SUB, a buffer layer BUF is deposited. Even though it is not shown in the figures, before depositing the buffer layer BUF, a light shield layer may be formed pm on the substrate SUB at desired areas.

In step S110, on the buffer layer BUF, an amorphous silicon (a-Si) material is deposited. A crystallization process is performed to convert the amorphous silicon layer into a polycrystalline silicon (poly-Si) layer. Using a first mask process, the polycrystalline silicon layer is patterned to form a first semiconductor layer.

In step S200, an insulating material is deposited on the whole surface of the substrate SUB having the first semiconductor layer to form a first gate insulating layer GI1. The first gate insulating layer GI1 may be made of a silicon oxide with a thickness between 1,000 Å and 2,000 Å. Then, a gate metal material is deposited. The gate metal material is patterned using a second mask process to form a first gate electrode G1. The first gate electrode G1 is disposed to overlap with the middle portion of the first semiconductor layer. After that, using the first gate electrode G1 as a mask, the impurities are doped into the areas of the first semiconductor layer not covered by the first gate electrode G1 so that the doping areas including the first source area SA1 and the first drain area DA1 are defined.

The details of the manufacturing processes for the doping areas may be slightly different for different types of thin film transistors, e.g., the P-MOS type, N-MOS type, or C-MOS type. For example of the N-MOS type, a high density doping area may be formed first, and then a low density doping area may be formed. A photo-resist pattern for the first gate electrode G1 which has a larger width than the first gate electrode G1 may be used to define the high density doping area. The photo-resist pattern is removed and the first gate electrode G1 is used as a mask to define the low density doping area (or, "LDD") between the high density doping area and the first gate electrode G1. If the C-MOS type thin film transistor is used, for example, the first thin film transistor T1 may be the P-MOS type thin film transistor, and the second thin film transistor T2 may be the N-MOS type thin film transistor.

In step S300, on the whole surface of the substrate SUB having the first gate electrode G1, a first intermediate insulating layer ILD1 is deposited. If the first intermediate insulating layer ILD1 has a double layer structure, for example, the nitride layer can be deposited first, and then the oxide layer can be deposited thereon. The nitride layer may include a large content of hydrogen particles. In view of the manufacturing process, the total thickness of the first intermediate insulating layer ILD1 may be between 2,000 Å and 6,000 Å. Therefore, the nitride layer may be deposited with a thickness between 1,000 Å and 3,000 Å. Further, the oxide layer, for preventing a significant amount of the hydrogen particles from being diffused from the nitride layer into the oxide semiconductor layer thereover, may be deposited with a thickness between 1,000 Å and 3,000 Å. The hydrogen diffusion efficiency and the element properties may be considered in selecting or deciding the thicknesses of the oxide layer and the nitride layer. For example, to prevent a large amount of the hydrogen particles from diffusing out, the nitride layer may be thinner than the oxide layer.

Also in step S300, the first gate insulating layer GI1 is patterned with a third mask process to form first contact holes. In particular, the first contact holes expose the first source area SA1 and the first drain area DA1.

In step 400, an oxide semiconductor material is deposited on the first intermediate insulating layer ILD1. The oxide semiconductor material may include at least one of an indium gallium zinc oxide (or "IGZO"), an indium gallium oxide (or "IGO"), or an indium zinc oxide (or "IZO"). The oxide semiconductor material is patterned with a fourth mask process to form the second semiconductor layer. Further, in the fourth mask process, the oxide semiconductor material is patterned also to form a first sub-source area SA1' contacting the first source area SA1 via one of the first contact holes and a first sub-drain area DA1' contacting the first drain area DA1 via another first contact hole.

In step S500, an insulating material is deposited on the whole surface of the substrate SUB having the second semiconductor layer to form a second gate insulating layer GI2. The second gate insulating layer GI2 may have substantially the same thickness and the same material as the first gate insulating layer GI1.

In step S510, on the second gate insulating layer GI2, a gate metal material is deposited. The gate metal material and the second gate insulating layer GI2 are patterned at the same time to form a second gate electrode G2. During the etching process to pattern the second gate insulating layer GI2, both side portions of the second semiconductor layer may be treated to become conductive. That is, the second source area SA2 and the second drain area DA2 exposed at the both sides of the second gate electrode G2 are made conductive. At the same time, the first sub-source area SA1' and the first sub-drain area DA1' may also be treated to become conductive.

In step S600, on the whole surface of the substrate SUB having the second gate electrode G2, a second intermediate insulating layer ILD2 is deposited. The second intermediate insulating layer ILD2 is patterned with a sixth mask process to form second contact holes. For example, the second contact holes may expose the second source area SA2, the second drain area DA2, the first sub-source area SA1', and the first sub-drain area DA1', each of which have been made conductive.

In step S700, a source-drain metal material is deposited on the second intermediate insulating layer ILD2. With a seventh mask process, the source-drain metal material is patterned to form source and drain electrodes of the first thin film transistor T1 and the second thin film transistor T2. For example, a first source electrode S1, a first drain electrode D1, a second source electrode S2, and a second drain electrode D2 are formed. The first source electrode S1 contacts the first sub-source area SA1' via one second contact hole. The first drain electrode D1 contacts the first sub-drain area DA1' via another second contact hole. The second source electrode S2 contacts the second source area SA2 via yet another second contact hole. The second drain electrode D2 contacts the second drain area DA2 via still another second contact hole.

In step S800, on the whole surface of the substrate SUB having the source and drain electrodes, a passivation layer PAS is deposited. Even though not shown in the figures, the passivation layer PAS may be patterned to form contact holes for exposing portions of the first and/or second drain electrodes D1 and/or D2.

Third Example Embodiment

Figure 5:
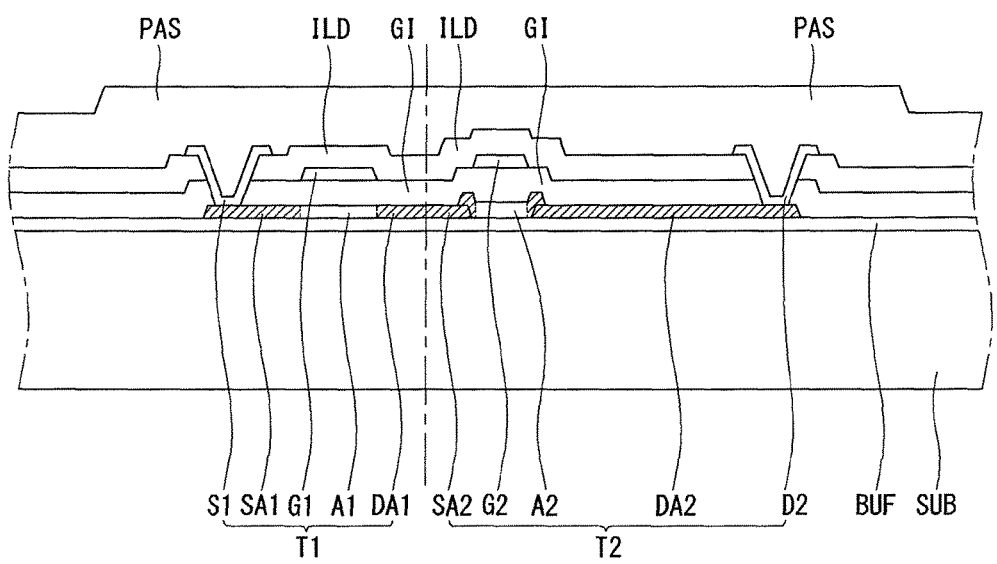
FIG. 5 is a cross sectional view illustrating a structure of a thin film transistor substrate for a flat panel display in which two different types of thin film transistors are formed, according to a third example embodiment of the present invention.

Hereinafter, the third example embodiment of the present invention is discussed with reference to FIG. 5. FIG. 5 is a cross sectional view illustrating a structure of a thin film transistor substrate for a flat panel display in which two different types of thin film transistors are formed, according to the third example embodiment of the present invention.

With respect to the features of the structure and the manufacturing process, the third example embodiment is very similar to the first example embodiment. The differences may include how a channel area is defined. For example, the channel area may be defined by a process to make the channel area conductive in the first example embodiment, whereas the channel area may be defined by a doping process in the third example embodiment. The third example embodiment may be more suitable for manufacturing the two different types of thin film transistors that are directly and/or serially connected to each other on the same substrate.

As shown in FIG. 5, on the base substrate SUB, a buffer layer BUF is deposited. On the buffer layer BUF, a first semiconductor layer including a polycrystalline semiconductor material is disposed. The first semiconductor layer is disposed where the first thin film transistor T1 is located and, in part, where the second thin film transistor T2 is located, respectively. At the first thin film transistor T1, the first semiconductor layer includes the first channel area A1. However, at the second thin film transistor T2, the first semiconductor layer is not formed where the second channel area A2 is disposed. The first thin film transistor T1 has the first channel area A1 made of the polycrystalline semiconductor material, but the second thin film transistor T2 has the second channel area A2 made of an oxide semiconductor material.

Therefore, for the second thin film transistor T2, a second semiconductor layer having an oxide semiconductor material is disposed between two separate parts of the first semiconductor layer. Especially, both side portions of the second semiconductor layer are stacked on one end portion of each of the two separate parts of the first semiconductor layers, connecting the two separate parts of the first semiconductor layer.

On the first semiconductor layer and the second semiconductor layer, a gate insulating layer GI is stacked to cover the whole surface of the substrate SUB. On the gate insulating layer GI, a first gate electrode G1 and the second gate electrode G2 are formed. The first gate electrode G1 is disposed to overlap with the middle portion of the part of the first semiconductor layer formed where the first thin film transistor T1 is located. The second gate electrode G2 is disposed to overlap with the middle portion of the second semiconductor layer formed where the second thin film transistor T2 is located.

The first gate electrode G1 overlaps with the first channel area A1 with the gate insulating layer GI therebetween. The portions of the first semiconductor layer at both sides of the first channel area A1 are doped with impurities to define a first source area SA1 and a first drain area DA1. Likely, the second gate electrode G2 overlaps with the second channel area A2 with the gate insulating layer GI therebetween. The portions of the second semiconductor layer at both sides of the second channel area A2 contact one end portion of each of the two separate areas of the first semiconductor layer, respectively. The impurities are doped into the portions of the second semiconductor layer at both sides of the second channel area A2 and portions of the first semiconductor layer, so that the second source area SA2 and the second drain area DA2 are defined.

On the first gate electrode G1 and the second gate electrode G2, an intermediate insulating layer ILD is deposited to cover the whole surface of the substrate SUB. On the intermediate insulating layer ILD, a first source electrode S1 of the first thin film transistor T1 and a second drain electrode D2 of the second thin film transistor T2 are disposed. The first source electrode S1 contacts the first source area SA1 through a contact hole penetrating the intermediate insulating layer ILD and the gate insulating layer GI. The second drain electrode D2 contacts the second drain area DA2 through another contact hole penetrating the intermediate insulating layer ILD and the gate insulating layer GI.

Here, the first drain area DA1 of the first thin film transistor T1 is formed as one body with the second source area SA2 of the second thin film transistor T2 such that these two thin film transistors are connected in series. Therefore, in the third example embodiment, the first drain electrode and the second source electrode are not separately formed.

On the whole surface of the substrate SUB having the first thin film transistor T1 and the second thin film transistor T2, a passivation layer PAS is deposited.

Figure 6:
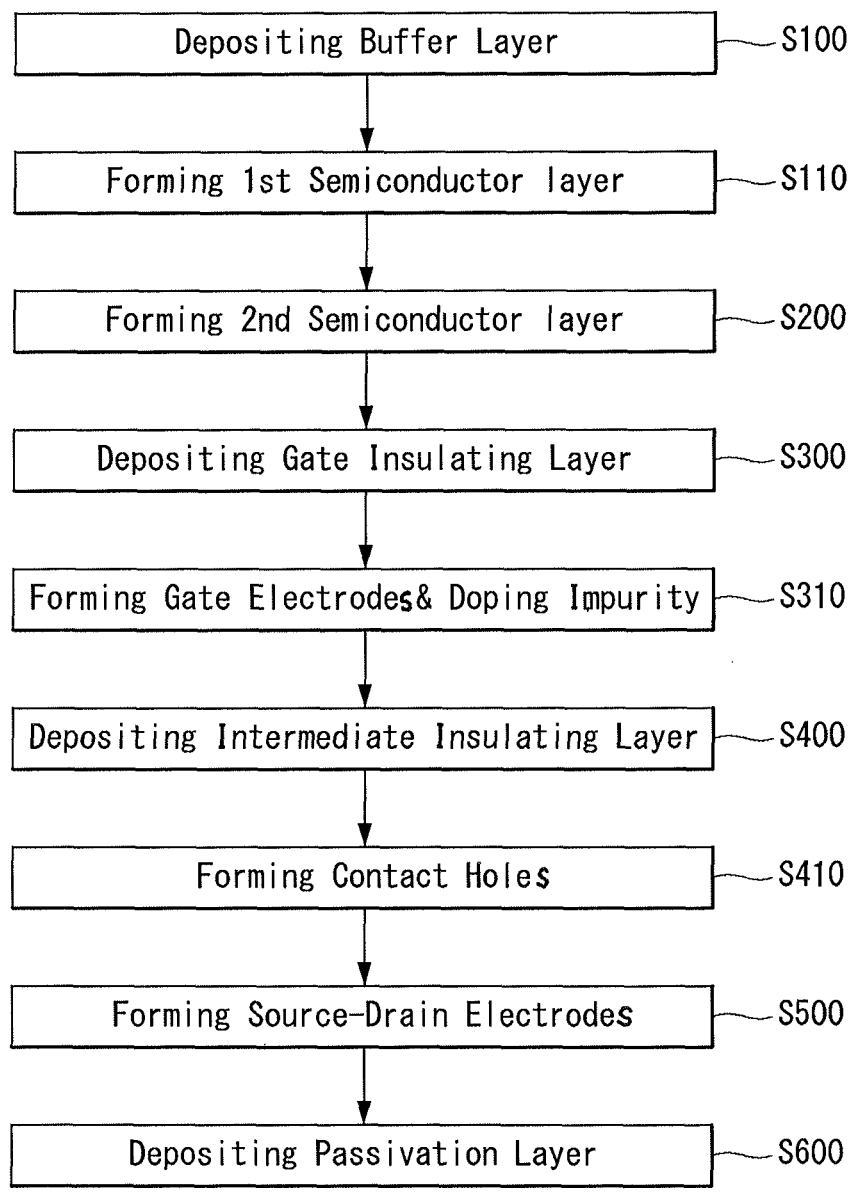
FIG. 6 is a flow chart illustrating a method for manufacturing the thin film transistor substrate for a flat panel display in which two different types of thin film transistors are formed, according to the third example embodiment of the present invention.

Hereinafter, the manufacturing method for the thin film transistor substrate of the flat panel display including two different types of thin film transistors on the same substrate according to the third example embodiment of the present invention is discussed with reference to FIG. 6. FIG. 6 is a flow chart illustrating a method for manufacturing the thin film transistor substrate having two different types of thin film transistors according to the third example embodiment of the present disclosure. The details of the features already discussed above may be omitted in the discussion below.

In step S100, on a base substrate SUB, a buffer layer BUF is deposited.

In step S110, on the buffer layer BUF, an amorphous silicon (a-Si) material is deposited. A crystallization process is performed to convert the amorphous silicon material converted into a poly crystalline silicon (poly-Si) material. With a first mask process, the poly crystalline silicon material is patterned to form a first semiconductor layer. The first semiconductor layer comprises a first channel area A1 of the first thin film transistor T1. Further, the first semiconductor layer includes the doping areas of the second thin film transistor T2.

In step S200, on the buffer layer BUF having the first semiconductor layer, a metal oxide semiconductor material is deposited. With a second mask process, the oxide semiconductor material is patterned to form a second semiconductor layer. The second semiconductor layer comprises a second channel area A2 of the second thin film transistor T2. The second semiconductor layer is formed to bridge the two separate areas of the first semiconductor layer disposed at both sides of the second channel area A2, where the second thin film transistor T2 is located.

In step 300, an insulating material is deposited on the whole surface of the substrate SUB having the first semiconductor layer and the second semiconductor layer to form a gate insulating layer GI.

In step S310, on the gate insulating layer GI, a gate metal material is deposited. With a third mask process, the gate metal layer is patterned to form the gate electrodes. In particular, a first gate electrode G1 for the first thin film transistor T1 and a second gate electrode G2 for the second thin film transistor T2 are formed at the same time. The first gate electrode G1 is disposed to overlap with the first channel area A1, the middle portion of the first semiconductor layer. The second gate electrode G2 is disposed to overlap with the second channel area A2, the middle portion of the second semiconductor layer. Using the first gate electrode G1 and the second gate electrode G2 as masks, impurities are doped into the first semiconductor layer and the second semiconductor layer. As a result, the two doped portions of the first semiconductor layer exposed at both sides of the first gate electrode G1 are defined as the first source area SA1 and the first drain area DA1, respectively. Likely, the impurities are doped into the two exposed portions of the second semiconductor layer and the first semiconductor layer exposed at both sides of the second gate electrode G2, so that the second source area SA2 and the second drain area DA2 are defined.

In step S400, on the whole surface of the substrate SUB having the first gate electrode G1 and the second gate electrode G2, an intermediate insulating layer ILD is deposited.

In step S410, with a fourth mask process, the intermediate insulating layer ILD is patterned to form contact holes for exposing the first source area SA1 and the second drain area DA2. These contact holes are for connecting the source and drain electrodes to the source and drain areas later.

In step S500, a source-drain metal material is deposited on the intermediate layer ILD having the contact holes. With a fifth mask process, the source-drain metal material is patterned to form a first source electrode S1 and a second drain electrode D2. The first source electrode S1 contacts the first source area SA1 through one of the contact holes. The second drain electrode D2 contacts the second drain area DA2 through another one of the contact holes.

In step S600, on the whole surface of the substrate SUB having the source-drain electrodes, a passivation layer PAS is deposited. Even though not shown in the figures, the passivation layer PAS may be patterned to form contact holes for exposing portions of the second drain electrodes D2.

The third example embodiment of the present disclosure provides a thin film transistor substrate having two different types of thin film transistors disposed and connected to each other in series on the same substrate. In particular, the first thin film transistor T1 having a polycrystalline semiconductor material and the second thin film transistor T2 having an oxide semiconductor material are connected to each other in series. For example, when it is desired to reduce the off-current significantly in the flat panel display, the oxide semiconductor material may be used for the second thin film transistor T2.

Further, the disclosed structures of the thin film transistors can be applied to a flat panel display in which a gate driver is directly formed in the non-display area surrounding the display area on the same substrate. For example, the gate driver can be formed to include a C-MOS type thin film transistor in which the P-MOS type thin film transistor including the polycrystalline semiconductor material and the N-MOS type thin film transistor including the oxide semiconductor material are connected each other in series.

Fourth Example Embodiment

Figure 7:
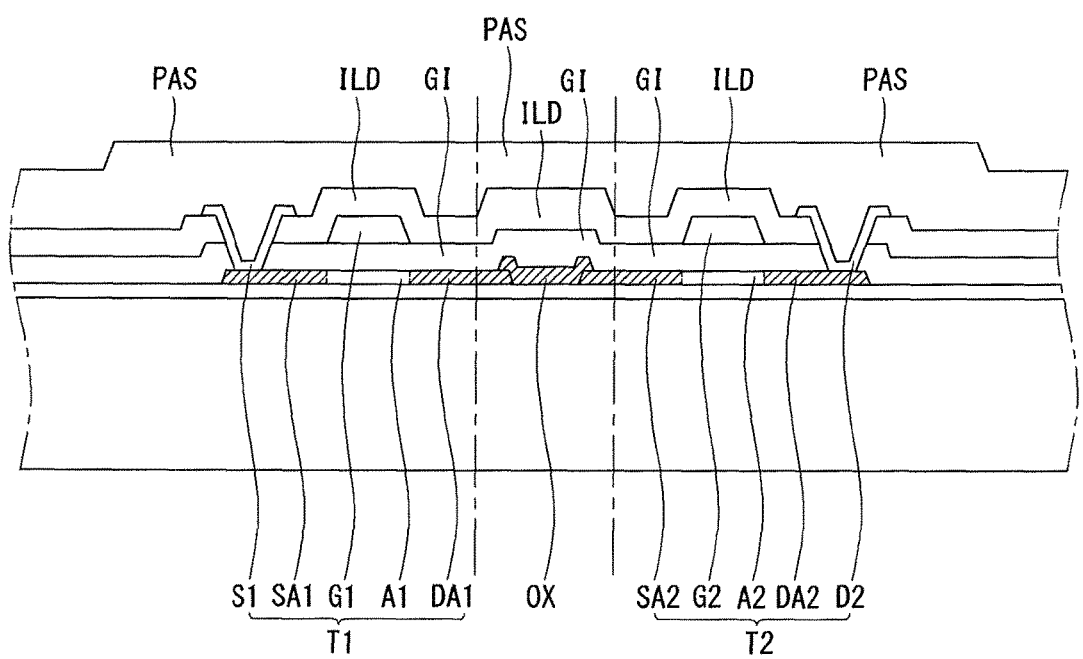
FIG. 7 is a cross sectional view illustrating a structure of a thin film transistor substrate for a flat panel display in which two different types of thin film transistors are formed, according to a fourth example embodiment of the present invention.

Hereinafter, the fourth example embodiment of the present invention is discussed with reference to FIG. 7. FIG. 7 is a cross sectional view illustrating a structure of a thin film transistor substrate for a flat panel display in which two different types of semiconductor materials are used, according to the fourth example embodiment of the present disclosure.

The fourth example embodiment provides a modified structure from the thin film transistor substrate having two different types of thin film transistors explained in the above example embodiments. To enhance the characteristics of the thin film transistors, two of the same type thin film transistors are connected in series via a different type semiconductor material therebetween. For example, in the case that two thin film transistors having the poly crystalline semiconductor material are serially connected, the off-current can be significantly reduced by inserting the oxide semiconductor material between these two thin film transistors to connect them.

In view of the characteristics of the structure and the manufacturing processes, the fourth example embodiment of the present disclosure is similar to the third embodiment. The differences include how two different types of semiconductor materials are used. Two thin film transistors having different types of semiconductor materials, respectively, are connected in series in the third example embodiment, whereas two thin film transistors having the same type semiconductor material are connected in series via a different type semiconductor material in the fourth example embodiment.

As shown in FIG. 7, on the substrate SUB, a buffer layer BUF is deposited. On the buffer layer BUF, a first semiconductor layer including a polycrystalline semiconductor material is disposed. The first semiconductor layer is disposed at the areas for the first thin film transistor T1 and the second thin film transistor T2.

The first thin film transistor T1 and the second thin film transistor T2 have the channel areas including the polycrystalline semiconductor material. Therefore, the first semiconductor layer is disposed at the channel area of each of the first thin film transistor T1 and the second thin film transistor T2.

On the substrate SUB having the first semiconductor layer, a second semiconductor layer OX including an oxide semiconductor material is formed. In particular, the second semiconductor layer is formed to bridge one part of the first semiconductor layer disposed at the first thin film transistor T1 and another separate part of the first semiconductor layer disposed at the second thin film transistor T2.

On the first semiconductor layer and the second semiconductor layer, a gate insulating layer GI is deposited to cover the whole surface of the substrate SUB. On the gate insulating layer GI, a first gate electrode G1 and a second gate electrode G2 are formed. The first gate electrode G1 is disposed to overlap with the middle portion of the part of the first semiconductor layer formed where the first thin film transistor T1 is located. The second gate electrode G2 is disposed to overlap with the middle portion of the separate part of the first semiconductor layer formed where the second thin film transistor T2 is located.

The first gate electrode G1 and the second gate electrode G2 overlap with the first channel area A1 and the second channel area A2, respectively, with the gate insulating layer GI therebetween. At both sides of the first channel area A1, a first source area SA1 and a first drain area DA1 are respectively defined as the impurity doped areas. Likely, at both sides of the second channel area A2, a second source area SA2 and a second drain area DA2 are respectively defined as the impurity doped areas. The first drain area DA1 and the second source area SA2 are connected to each other by the second semiconductor layer (or the oxide semiconductor layer) OX. The second semiconductor layer OX is doped with impurities.

On the first gate electrode G1 and the second gate electrode G2, an intermediate insulating layer ILD is deposited to cover the whole surface of the substrate SUB. On the intermediate insulating layer ILD, a first source electrode S1 of the first thin film transistor T1 and a second drain electrode D2 of the second thin film transistor T2 are disposed. The first source electrode S1 contacts the first source area SA1 through a contact hole penetrating the intermediate insulating layer ILD and the gate insulating layer GI. The second drain electrode D2 contacts the second drain area DA2 through another contact hole penetrating the intermediate insulating layer ILD and the gate insulating layer GI.

Here, the first drain area DA1 of the first thin film transistor T1 is connected in series to the second source area SA2 of the second thin film transistor T2 via the oxide semiconductor layer OX. Therefore, in the forth example embodiment, the first drain electrode and the second source electrode are not formed.

On the whole surface of the substrate SUB having the first thin film transistor T1 and the second thin film transistor T2, a passivation layer PAS is deposited. The manufacturing process is very similar to that of the third example embodiment, so the discussion of the manufacturing process is not repeated.

Fifth Example Embodiment

Figure 8:
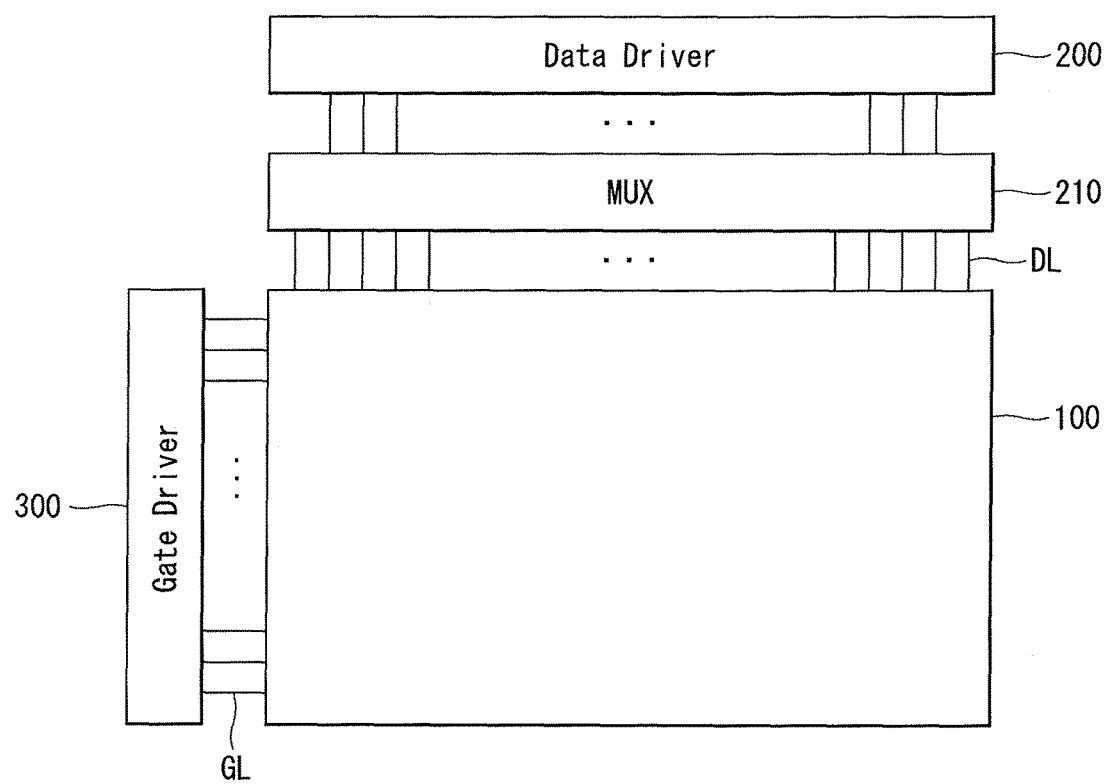
FIG. 8 is a block diagram illustrating a structure of the display according to a fifth example embodiment of the present invention.

The thin film transistor substrate having two different types of thin film transistors or two different types of semiconductor materials on the same substrate, as discussed above, can be applied to various types of displays including a flat panel display, a flexible display and/or a curved display. Various advantages can be obtained by incorporating two different types of thin film transistors on the same substrate. Hereinafter, with reference to FIG. 8, various advanced features and advantages that can be possible or expected from the thin film transistor substrate according to a fifth example embodiment of the present invention are discussed. FIG. 8 is a block diagram illustrating a structure of the display according to the fifth example embodiment of the present invention.

The first and the second transistors T1 and T2 may be formed in each pixel of the display panel 100 for switching the data voltage applied to the pixel or for driving the pixel. For the case of an organic light emitting diode display, the second thin film transistor T2 may be a switch element for the pixel, and the first thin film transistor T1 may be a driver element. However, possible applications are not limited to this particular example. For example, by combining the first and the second thin film transistors T1 and T2, they may be configured to operate as one switch element or one driver element.

For a mobile device or a wearable device, in order to reduce the power consumption, a relatively low speed driving method using a low frame rate is adopted. In this case, the frame frequency may be lowered for still image and/or the images having a slower update interval. Here, when the lower frame rate is used, at every time the data voltage changes, the brightness of the display may flash. In some cases, as the discharging time interval is elongated, the brightness may flicker at every data update period. By applying the first and the second thin film transistors T1 and T2 on the same substrate according to the present invention, the flicker problem at lower speed driving method can be prevented.

Also, in the lower speed driving method, as the data update period is elongated, the amount of leaked current of the switching thin film transistor may increase. The leaked current of the switching thin film transistor may cause a drop in the voltage of the storage capacitance and/or in the voltage between the gate and source of the driving thin film transistor. The second thin film transistor having the oxide semiconductor material can be used as the switching thin film transistor of the organic light emitting diode display. As a thin film transistor including an oxide semiconductor material has relatively low off-current characteristics, the drop in the voltage of the storage capacitance and/or in the gate-source voltage of the driving thin film transistor can be prevented or reduced. Thus, the flicker phenomenon resulting from the use of the lower speed driving method may be prevented or reduced.

As the polycrystalline silicon has the characteristics of high mobility, by using the first thin film transistor as the driving thin film transistor of the organic light emitting diode display, the current amount supplied to the organic light emitting diode can be increased. Therefore, implementing the second thin film transistor T2 as the switching thin film transistor and the first thin film transistor T1 as the driving thin film transistor, the organic light emitting diode display may have lower power consumption and better video quality.

As the thin film transistor substrate according to the present invention provides for excellent video quality without or with less flicker even at a relatively low speed driving, it is very suitable for use in the mobile display or the wearable display. For example of a wearable wrist watch, the video data may be updated at every one second for reducing the power consumption. In that case, the frame frequency is 1 Hz. The display according to the present invention can provide for excellent video quality with little to no flicker even though the video data is driven at a low frequency, such as 1 Hz or lower. Further, for the mobile display or the wearable display, the frame rate for the still image can be lower so that the power consumption can be reduced without degrading the video quality. As a result, the video quality of the mobile display and/or wearable display can be improved, and the life time of the battery can be increased. In addition, the display according to the present invention can be applied to electric book devices (or "E-Books") whose data update period is very long to reduce power consumption without degrading the video quality.

At least one of the first and the second thin film transistors T1 and T2 may be embedded into a driver circuit, for example as shown in FIG. 8, in one or more of the data driver 200, the multiplexer (or "MUX") 210, and the gate driver 300, that form a driver circuit. This driver circuit writes and/or applies the data voltage to the pixel. In another example, any one of the first and the second thin film transistors T1 and T2 may be disposed within a pixel in the display area, and the other disposed in the driver circuit in the non-display area. The data driver 200 converts the input video data into the voltage values and output the voltage values. The multiplexer 210 may reduce the number of output channels of the data driver 200, by distributing the data voltages from the data driver 200 to the data lines DL by a time-sharing or time-division method. The gate driver 300 outputs the scan signal (or "gate signal") to the gate lines GL synchronized to the data voltage for sequentially selecting the pixel line where the data voltage is to be applied. To reduce the number of output channels of the gate driver 300, other multiplexers not shown in the figures may be further included between the gate driver 300 and the gate lines GL. The multiplexer 210 and the gate driver 300 may be formed on the same thin film transistor substrate with the pixel array 100, as shown in FIG. 8. The multiplexer 210 and the gate driver 300 may be disposed within the non-display area and the pixel array may be disposed within the display area of the thin film transistor substrate.

The thin film transistor substrate according to the present invention may be applied to any type of display requiring an active matrix thin film transistor substrate such as the liquid crystal display, the organic light emitting diode display and/or the electrophoresis display device. Hereinafter, more example embodiments providing for more applications for the display using the thin film transistor substrate according to the present invention.

Sixth Example Embodiment

Figure 9:
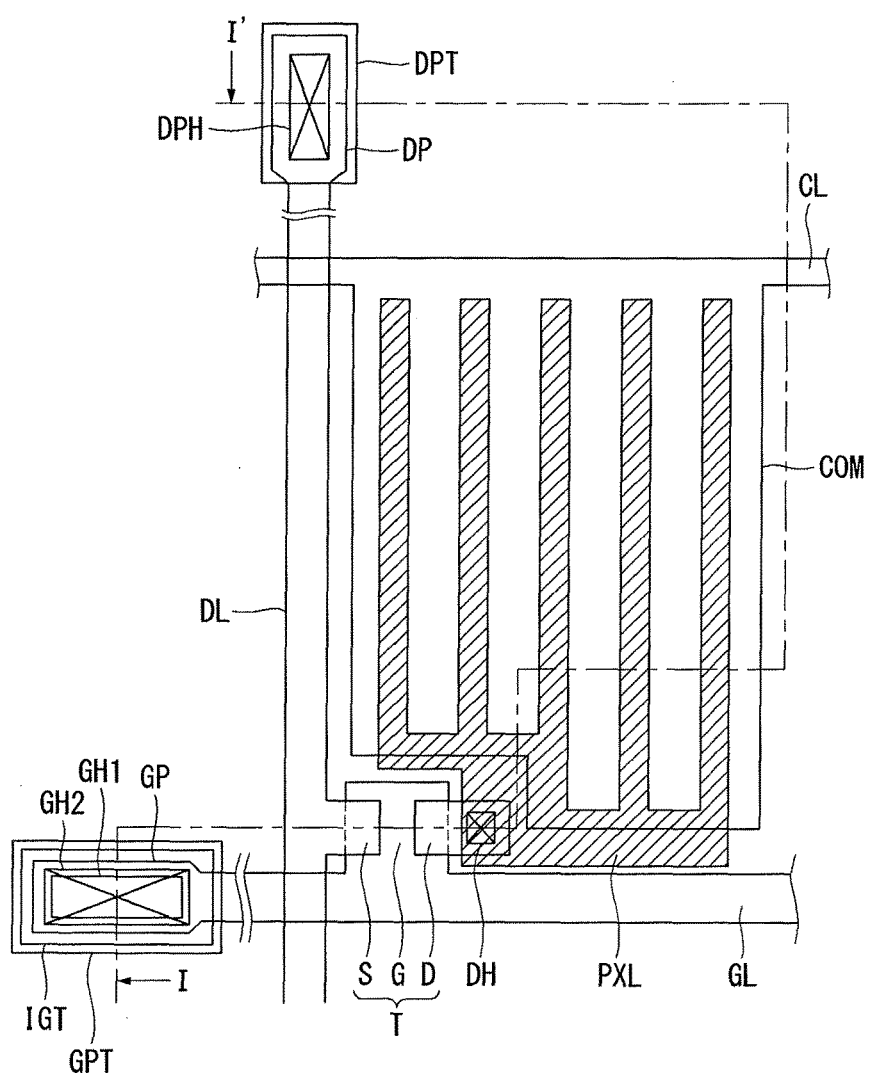
FIG. 9 is a plane view illustrating a thin film transistor substrate having an oxide semiconductor layer included in a fringe field type liquid crystal display according to a sixth example embodiment of the present invention.
Figure 10:
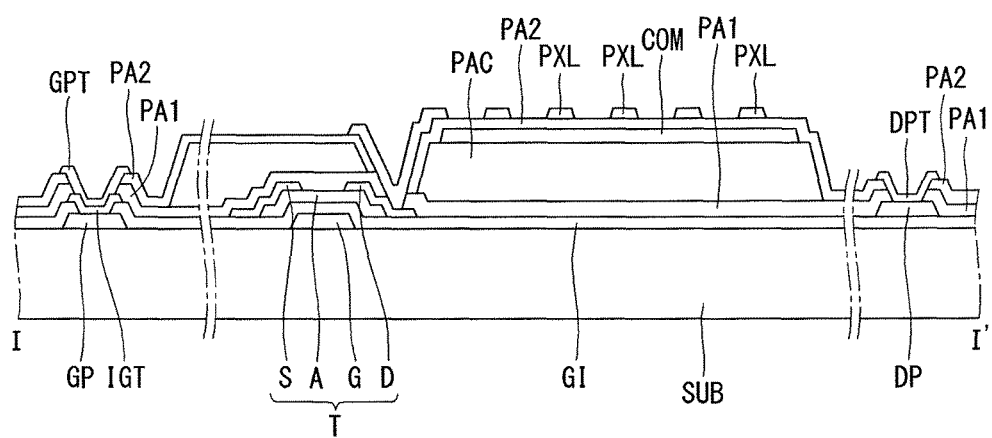
FIG. 10 is a cross-sectional view illustrating the structure of the thin film transistor substrate along the line I-I' in FIG. 9, according to the sixth example embodiment of the present invention.

FIG. 9 is a plane view illustrating a thin film transistor substrate having an oxide semiconductor layer included in a fringe field type liquid crystal display according to a sixth example embodiment of the present invention. FIG. 10 is a cross-sectional view illustrating the structure of the thin film transistor substrate of FIG. 9 along line I-I' of FIG. 9, according to the sixth example embodiment of the present invention.

The thin film transistor substrate having a metal oxide semiconductor layer shown in FIGS. 9 and 10 comprises a gate line GL and a data line DL crossing each other with a gate insulating layer GI therebetween on a lower substrate SUB, and a thin film transistor T formed at the crossing portion. By the crossing structure of the gate line GL and the data line DL, a pixel area is defined.

The thin film transistor T comprises a gate electrode G branched (or "protruded") from the gate line GL, a source electrode S branched from the data line DL, a drain electrode D separated from the source electrode S, and a semiconductor layer A on the gate insulating layer GI and overlapping the gate electrode G for forming a channel area between the source electrode S and the drain electrode D.

At one end of the gate line GL, a gate pad GP is disposed for receiving the gate signal. The gate pad GP is connected to a gate pad intermediate terminal IGT through the first gate pad contact hole GH1 penetrating the gate insulating layer GI. The gate pad intermediate terminal IGT is connected to the gate pad terminal GPT through the second gate pad contact hole GH2 penetrating the first passivation layer PA1 and the second passivation layer PA2. Further, at one end of the data line DL, a data pad DP is disposed for receiving the pixel signal. The data pad DP is connected to a data pad terminal DPT through the data pad contact hole DPH penetrating the first passivation layer PA1 and the second passivation layer PA2.

In the pixel area, a pixel electrode PXL and a common electrode COM are formed with the second passivation layer PA2 therebetween to form a fringe electric field. The common electrode COM is connected to the common line CL disposed in parallel with the gate line GL. The common electrode COM is supplied with a reference voltage (or "common voltage") via the common line CL. In another example, the common electrode COM may have the one sheet electrode shape which covers the whole surface of the substrate SUB except the drain contact hole DH portions.

That is, covering over the data line DL, the common electrode COM can work as a shielding means for the data line DL.

The common electrode COM and the pixel electrode PXL can have various shapes and positions according to the design purpose and environment. While the common electrode COM is supplied with a reference voltage having a constant value, the pixel electrode PXL is supplied with a data voltage that varies according to the video data. Therefore, between the data line DL and the pixel electrode PXL, a parasitic capacitance may be formed. Due to the parasitic capacitance, the video quality of the display may be degraded. Therefore, the common electrode COM may be disposed first, and the pixel electrode PXL may be disposed over the common electrode COM.

In other words, on the first passivation layer PA1 covering the data line DL and the thin film transistor T, a planarization layer PAC is stacked by thickly depositing an organic material having a low permittivity. Then, the common electrode COM is formed on the planarization layer PAC. Then, after the second passivation layer PA2 is deposited to cover the common electrode COM, the pixel electrode PXL overlapping with the common electrode is formed on the second passivation layer PA2. In this structure, the pixel electrode PXL is far from the data line DL, separated by the first passivation layer PA1, the planarization layer PAC and the second passivation layer PA2, so that the parasitic capacitance between the data line DL and the pixel electrode PXL can be reduced. In another example, the pixel electrode PXL may be disposed first and the common electrode COM is disposed over the pixel electrode PXL.

The common electrode COM may have a rectangular shape corresponding to the pixel area. The pixel electrode PXL may have the shape of a plurality of segments. In particular, the pixel electrode PXL overlaps with the common electrode COM with the second passivation layer PA2 therebetween. Between the pixel electrode PXL and the common electrode COM, a fringe electric field is formed. By this fringe electric field, the liquid crystal molecules arranged in a plane direction between the thin film transistor substrate and the color filter substrate may be rotated according to the dielectric anisotropy of the liquid crystal molecules. According to the rotation degree of the liquid crystal molecules, the light transmittance ratio of the pixel area may be changed so as to represent a desired gray scale.

In FIGS. 9 and 10 for explaining the sixth example embodiment of the present disclosure, for convenience, the thin film transistor T of the liquid crystal display is not shown in all possible detail. However, the first and/or the second thin film transistors T1 and/or T2 detailed in the first to fourth example embodiments of the present disclosure can be applied to this thin film transistor. For example, if a low speed driving is required, the second thin film transistor T2 having the oxide semiconductor material can be implemented as the thin film transistor T. For another example, if a low power consumption is required, the first thin film transistor T1 having the polycrystalline semiconductor material may be implemented as the thin film transistor T. For still another example, the thin film transistor T may be formed as including the first and the second thin film transistors T1 and T2 connected to each other so that the performance and the characteristics of both thin film transistors can compensate for and complement each other.

Seventh Example Embodiment

Figure 11:
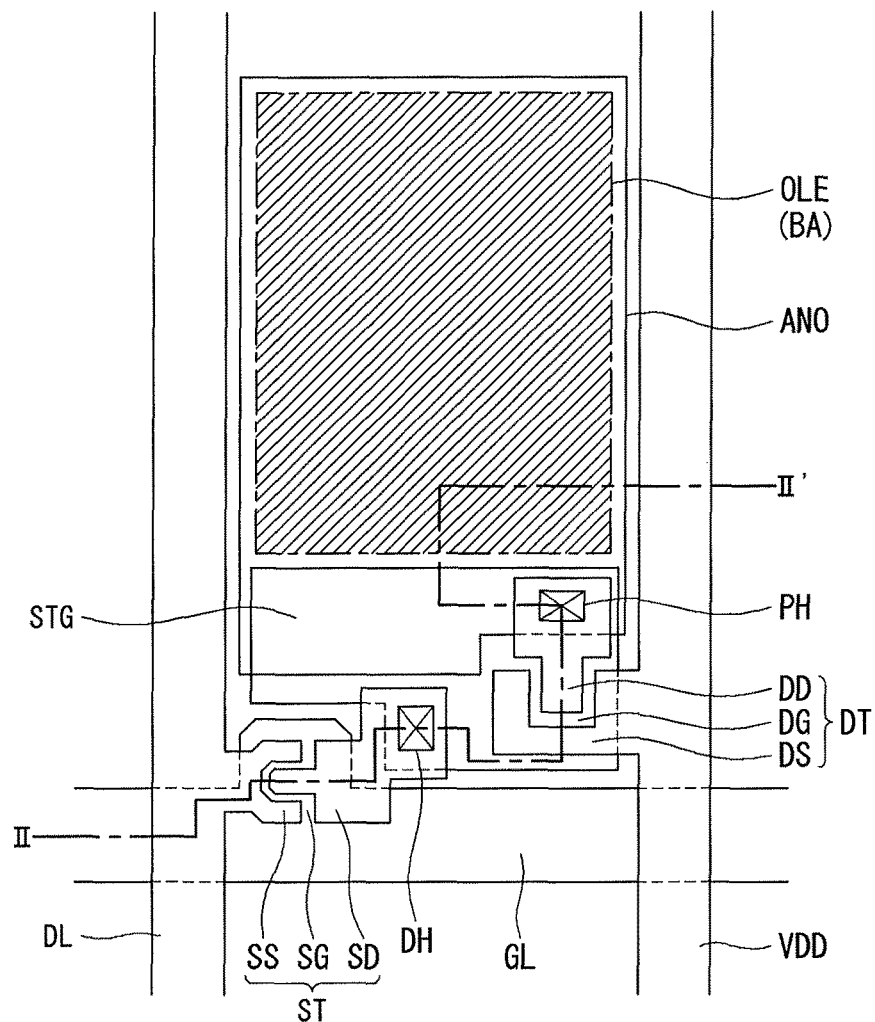
FIG. 11 is a plane view illustrating a structure of one pixel in an active matrix type organic light emitting diode display having active switching elements, such as thin film transistors, according to a seventh example embodiment of the present invention.
Figure 12:
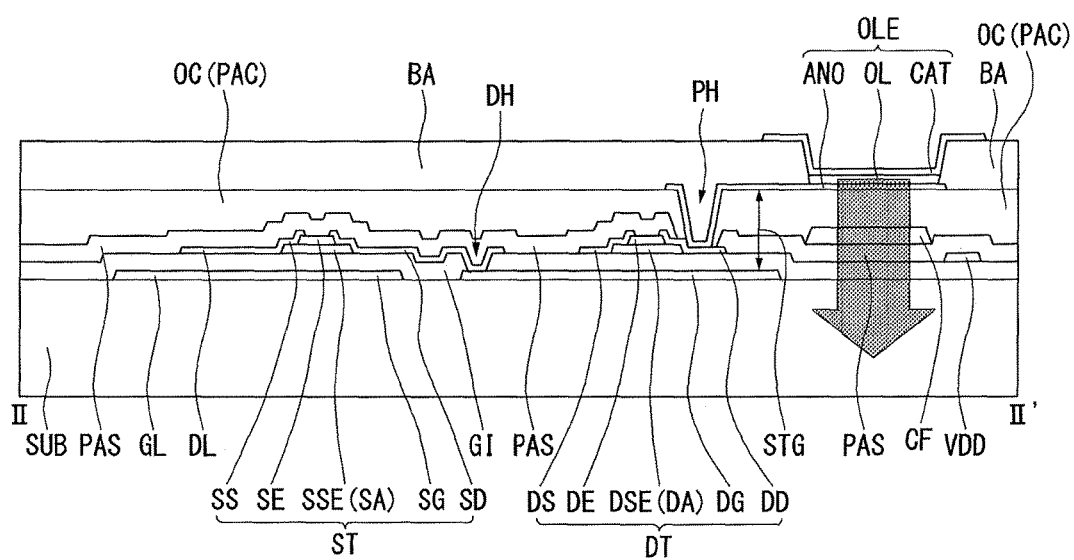
FIG. 12 is a cross sectional view illustrating the structure of the organic light emitting diode display along line II-II' in FIG. 11, according to the seventh example embodiment of the present invention.

FIG. 11 is a plane view illustrating the structure of one pixel for the active matrix type organic light emitting diode display having the active switching elements such as the thin film transistors according to a seventh example embodiment of the present invention. FIG. 12 is a cross sectional view illustrating the structure of the organic light emitting diode display along line II-II' in FIG. 11 according to the seventh example embodiment of the present disclosure.

As shown in FIGS. 11 and 12, the active matrix type organic light emitting diode display comprises a switching thin film transistor ST, a driving thin film transistor DT connected to the switching thin film transistor ST, and an organic light emitting diode OLE connected to the driving thin film transistor DT.

The switching thin film transistor ST is formed where a gate line GL and a data line DL cross each other on a substrate SUB. Supplying the data voltage from the data line DL to the gate electrode DG of the driving thin film transistor DT and to the storage capacitance STG in response to the scan signal, the switching thin film transistor ST serves a function of selects the pixel. The switching thin film transistor ST includes a gate electrode SG branching from the gate line GL, a semiconductor channel layer SA overlapping with the gate electrode SG, a source electrode SS and a drain electrode SD. Controlling the amount of the current applied to the organic light emitting diode OLE of the pixel according to the gate voltage, the driving thin film transistor DT serves a function of driving the organic light emitting diode OLE disposed at the pixel selected by the switching thin film transistor ST.

The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE. Between the anode electrode ANO and the cathode electrode CAT, an organic light emitting layer OL is disposed. The cathode electrode CAT is connected to the ground line Vss (not shown).

As shown in FIG. 12 in more detail, on the substrate SUB of the active matrix organic light emitting diode display, the gate electrodes SG and DG of the switching thin film transistor ST and the driving thin film transistor DT, respectively are disposed. On the gate electrodes SG and DG, the gate insulator GI is deposited. On the gate insulator GI overlapping with the gate electrodes SG and DG, the semiconductor layers SA and DA are disposed, respectively. On the semiconductor layers SA and DA, the source electrodes SS and DS and the drain electrodes SD and DD, respectively separated from the source electrodes SS and DS, are disposed. The drain electrode SD of the switching thin film transistor ST is connected to the gate electrode DG of the driving thin film transistor DT via the drain contact hole DH penetrating the gate insulator GI. The passivation layer PAS is deposited on the substrate SUB having the switching thin film transistor ST and the driving thin film transistor DT.

A color filer CF is disposed at the area where the anode electrode ANO is to be disposed. The color filter CF may have as large of an area as possible. For example, the color filter may overlap with as large of a portion of the data line DL, the driving current line VDD, and/or the gate line GL as possible. The upper surface of the substrate having these thin film transistors ST and DT and color filters CF may not be in even and/or smooth conditions, but in uneven and/or rugged conditions having many steps. In order for the organic light emitting diode display to have good luminescent quality over the whole display area, the organic light emitting layer OL should have an even or smooth surface.

So, to make the upper surface more planar and even, the planar layer PAC or the over coat layer OC may be deposited on the whole surface of the substrate SUB.

Then, on the over coat layer OC, the anode electrode ANO of the organic light emitting diode OLED is disposed. Here, the anode electrode ANO is connected to the drain electrode DD of the driving thin film transistor DT through the pixel contact hole PH penetrating the over coat layer OC and the passivation layer PAS.

On the substrate SUB having the anode electrode ANO, a bank (or a "bank pattern") BA is disposed over the area having the switching thin film transistor ST, the driving thin film transistor DT, and the various lines DL, GL and VDD for defining the pixel area. The portion of the anode electrode ANO exposed by the bank BA would be the light emitting area. On the anode electrode ANO exposed from the bank BA, the organic light emitting layer OL is deposited. On the organic light emitting layer OL, the cathode electrode ACT is deposited. For an example in which the organic light emitting layer OL has a material emitting white light, each pixel can represent various colors by the color filter CF disposed under the anode electrode ANO. The organic light emitting diode display as shown in FIG. 12 is the bottom emission type display in which the visible light is radiated toward the bottom direction of the display substrate.

Between the gate electrode DG of the driving thin film transistor DT and the anode electrode ANO, a storage capacitance STG may be formed. By being connected to the driving thin film transistor DT, the storage capacitance STG keeps the voltage supplied to the gate electrode DG of the driving thin film transistor DT from the switching thin film transistor ST stable.

By using the thin film transistor substrate according to the present invention and example embodiments as detailed above, an active type flat panel display having good properties can be provided. In particular, to provide for excellent driving properties, the active layer of the thin film transistor may include a metal oxide semiconductor material.

The metal oxide semiconductor material may have its characteristics degraded when it operates while being exposed to the light for a long time. Therefore, a structure may be included to block the light from entering the thin film transistor having a metal oxide semiconductor material from below or above the thin film transistor. For example, for the thin film transistor substrates detailed above, the thin film transistors may be formed in the bottom gate structure. That is, the light introduced from the outside of substrate, especially from the lower side of the substrate, can be blocked by the gate electrode G including an opaque metal material.

The thin film transistor substrate for the flat panel display has a plurality of pixel areas disposed in a matrix form. Further, each pixel area includes at least one thin film transistor. That is, over the whole substrate, a plurality of thin film transistors is disposed. Because the plurality of pixel areas and the plurality of thin film transistors are used for the same purpose and should have the same quality and characteristics, they have the same structure.

However, in some cases, it may be desirable or necessary to provide the thin film transistors with different characteristics. For an example of the organic light emitting diode display, in one pixel area, at least one switching thin film transistor ST and at least one driving thin film transistor DT are disposed. As the respective purposes of the switching thin film transistor ST and the driving thin film transistor DT are different from each other, their required characteristics are also different from each other. To accommodate these differences, the switch thin film transistor ST and the driving thin film transistor DT may have the same basic structure and the same semiconductor material, but their channel layers may have different sizes for optimizing their respective characteristics. Otherwise, a compensating thin film transistor may further be included for supporting any specific functions or properties of any thin film transistor.

In FIGS. 11 and 12 for explaining the seventh example embodiment of the present invention, for convenience, the switching thin film transistor ST and the driving thin film transistor DT of the organic light emitting diode display are not shown with all possible detail. However, the first and/or the second thin film transistors T1 and/or T2 detailed in the first to fourth example embodiments of the present invention can be applied to the thin film transistors ST and DT. For example, the second thin film transistor T2 having the oxide semiconductor material can be implemented as the switching thin film transistor ST. Also, the first thin film transistor T1 having the polycrystalline semiconductor material may be implemented as the driving thin film transistor DT. Therefore, by including the first and the second thin film transistors T1 and T2 on one substrate, their performance and the characteristics can compensate for and complement each other.

Eighth Example Embodiment

For still another example embodiment, a driver element (e.g., a "driver IC") may be formed in the non-display area of the same thin film transistor substrate for the flat panel display as the pixel areas. Hereinafter, with reference to FIGS. 13 and 14, the thin film transistor substrate having the driver IC on the same substrate as the pixel areas.

Figure 13:
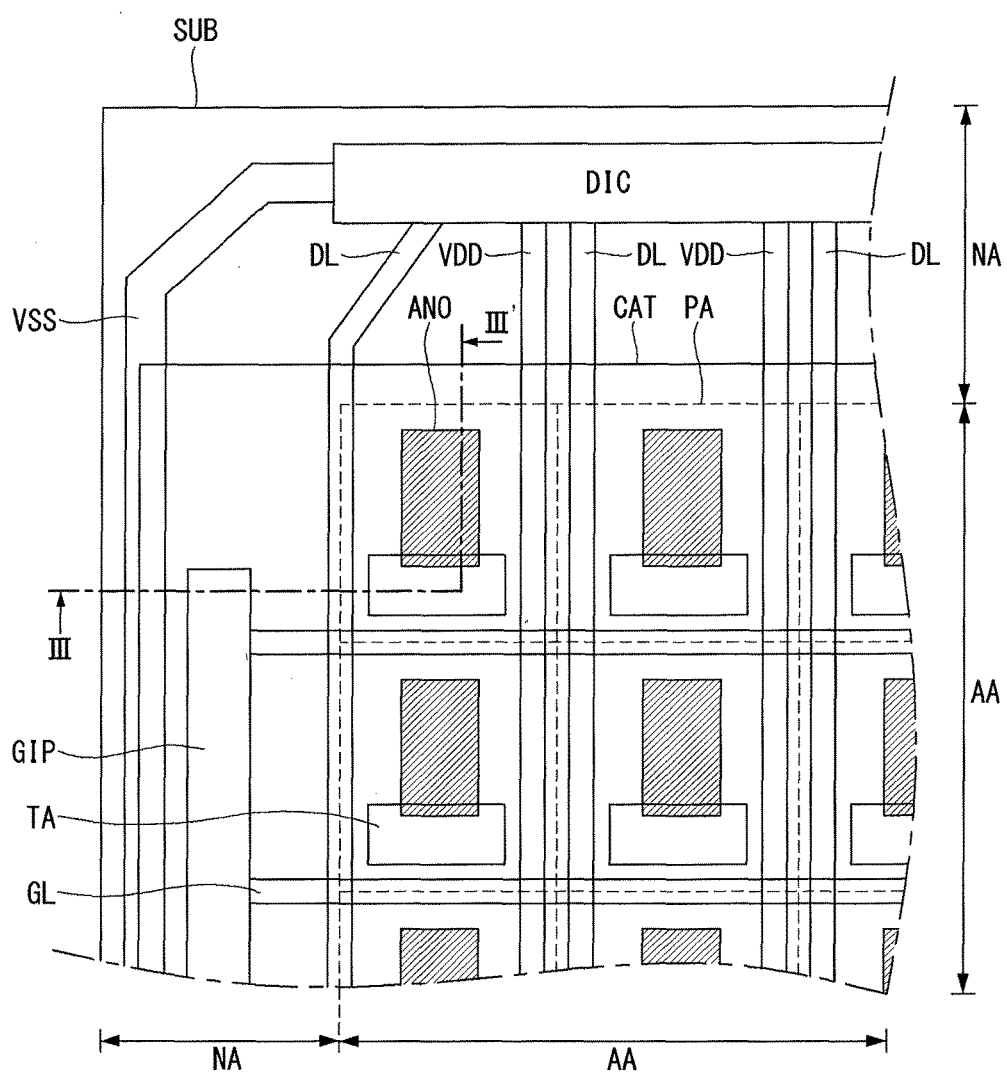
FIG. 13 is an enlarged plane view illustrating a structure of an organic light emitting diode display according to an eighth example embodiment of the present invention.
Figure 14:
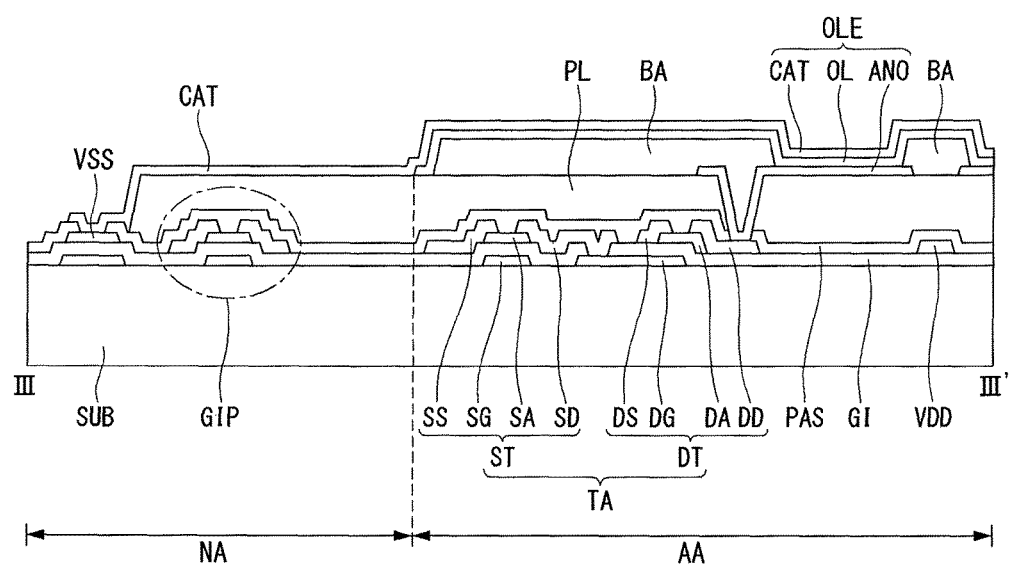
FIG. 14 is a cross sectional view illustrating a structure of the organic light emitting diode display along line III-III' in FIG. 13, according to the eighth example embodiment of the present invention.

FIG. 13 is an enlarged plane view illustrating a structure of an organic light emitting diode display according to an eighth example embodiment of the present invention. FIG. 14 is a cross sectional view illustrating a structure of the organic light emitting diode display along line III-III' in FIG. 13, according to the eighth example embodiment of the present invention. Here, for the discussion focuses more on the driver element embedded in the thin film transistor substrate that also includes display elements, the detailed features of the thin film transistors and the organic light emitting diode in the pixel areas already discussed above may be omitted.

First, with reference to FIG. 13, the plane structure of the organic light emitting diode display according to the eighth example embodiment is discussed in detail. An organic light emitting diode display according to the eighth example embodiment comprises a base substrate SUB including a display area AA for displaying the video information and a non-display area NA having various elements for driving the elements in the display area AA. In the display area AA, a plurality of pixel areas PA disposed in a matrix form is defined. In FIG. 13, the pixel areas PA are illustrated with the dotted lines.

For example, the pixel areas PA can be defined as an N (row)×M (column) matrix. However, the disposed pattern is not restricted to this particular form, and may have various different shapes and forms. Each of the pixel areas PA may have the same size or a different size. With one unit pixel having at least three sub pixels including red (R), green (G) and blue (B) sub pixels, the unit pixels may be uniformly disposed. In a simple sense, the pixel areas PA can be defined by the crossing of a plurality of gate lines GL running in a horizontal direction and a plurality of data lines DL running in a vertical direction.

In the non-display area NA defined as the peripheral area surrounding the pixel area PA, a data driving integrated circuit DIC for supplying the video data to the data lines DL and a gate driving integrated circuit GIP for supplying the scan signal to the gate lines GL are disposed. For an example of a display panel with a higher resolution than the VGA, in which more data lines DL and more driving current lines VDD are required, the data driving integrated circuit DIC may be installed external to the substrate SUB, and data contact pads may be disposed on the substrate SUB instead of the data driving integrated circuit DIC.

To simply show the structure of the display, the gate driving integrated circuit GIP is formed on one side portion of the substrate SUB directly. The ground line Vss for supplying the ground voltage may be disposed at an outer portion of the substrate SUB. The ground line Vss is disposed as to receive the ground voltage from external device located out of the substrate SUB, and to supply the ground voltage to the data driving integrated circuit DIC and the gate driving integrated circuit GIP. For example, the ground line Vss may be linked to the data driving integrated circuit DIC disposed at the upper side of the substrate SUB and to the gate driving integrated circuit GIP disposed at the right side and/or left side of the substrate SUB so as to surround the substrate SUB.

At each pixel area PA, the main elements such as an organic light emitting diode and thin film transistors for driving the organic light emitting diode are disposed. The thin film transistor is disposed at the thin film transistor area TA defined at one side of the pixel area PA. The organic light emitting diode includes an anode electrode ANO, a cathode electrode CAT and an organic light emission layer OL disposed between these two electrodes. The actual emission area is decided by the area of the organic light emission layer OL overlapping the anode electrode ANO.

The anode electrode ANO has a shape to occupy a portion of the pixel area PA and is connected to the thin film transistor formed in the thin film transistor area TA. The organic light emission layer OL is deposited on the anode electrode ANO. The cathode electrode CAT is deposited on the organic light emission layer OL so as to cover the whole surface of the display area AA having the pixel areas PA.

The cathode electrode CAT may go over the gate driving integrated circuit GIP and contact the ground line Vss disposed at the outer portion of the substrate SUB. In other words, the ground voltage can be supplied to the cathode electrode CAT through the ground line Vss. The cathode electrode CAT receives the ground voltage, and the anode electrode ANO receives the voltage corresponding to the video data. Based on the voltage difference between the cathode electrode CAT and the anode electrode ANO, the organic light emission layer OL radiates the light to represent the video information.

With further reference to FIG. 14, the cross-sectional structure of the organic light emitting diode display according to the eighth example embodiment is discussed in detail. On the substrate SUB, a non-display area NA and a display area AA are defined. The non-display area NA includes the gate driving integrated circuit GIP and the ground line Vss. The display area AA includes a switching thin film transistor ST, a driving thin film transistor DT, and an organic light emitting diode OLE.

The gate driving integrated circuit GIP has thin film transistors which are formed when the switching thin film transistor ST and the driving thin film transistor DT are formed. The switching thin film transistor ST in the pixel area PA has a gate electrode SG, a gate insulating layer GI, a channel layer SA, a source electrode SS and a drain electrode SD. In addition, the driving thin film transistor DT has a gate electrode DG connected to the drain electrode SD of the switching thin film transistor ST, the gate insulating layer GI, a channel layer DA, a source electrode DS and a drain electrode DD.

On the thin film transistors ST and DT, a passivation layer PAS and a planar layer PL are sequentially deposited. On the planar layer PL, an anode electrode ANO having a rectangular island shape within the pixel area PA is disposed. The anode electrode ANO connects to the drain electrode DD of the driving thin film transistor DT through the contact hole penetrating the passivation layer PAS and the planar layer PL.

On the substrate SUB having the anode electrode ANO, a bank BA is deposited to define the emission area. By patterning the bank BA, the most center portions of the anode electrode ANO are exposed. On the exposed anode electrode ANO, an organic light emission layer OL is deposited. By depositing a transparent conductive material on the bank BA and the organic light emission layer OL, the cathode electrode CAT is stacked. The organic light emitting diode OLED including the anode electrode ANO, the organic light emission layer OL and the cathode electrode CAT is disposed.

In an example in which the organic light emission layer OL may generate white light, color filters CF may be further included to represent full color video information. In that example, the organic light emission layer OL may be deposited to cover the whole surface of the display area AA.

The cathode electrode CAT may extend over the gate driving integrated circuit GIP so that it may cover the display area AA and the non-display area NA and contact the ground line Vss disposed at the outer portion of the substrate SUB. As a result, the ground voltage (or a reference voltage) can be supplied to the cathode electrode CAT via the ground line Vss.

In addition, the ground line Vss may be formed at the same layer and made of the same material as the gate electrodes SG and DG. In that case, the cathode electrode CAT can be connected to the ground line Vss through the contact hole penetrating the passivation layer PAS and the gate insulating layer GI over the ground line Vss. Otherwise, the ground line Vss may be formed at the same layer and made of the same material as the source and drain electrodes SS, SD, DD, and DD. In this case, the cathode electrode CAT can be connected to the ground line Vss through the contact hole penetrating the passivation layer PAS over the ground line Vss.

In FIGS. 13 and 14 for explaining the eighth example embodiment of the present invention, for convenience, the switching thin film transistor ST and the driving thin film transistor DT of the organic light emitting diode display are not shown in detail. However, the first and/or the second thin film transistors T1 and/or T2 detailed in the first to fourth example embodiments of the present invention can be applied to these thin film transistors. For example, the second thin film transistor T2 having the oxide semiconductor material can be implemented as the switching thin film transistor ST. The first thin film transistor T1 having the polycrystalline semiconductor material may be implemented as the driving thin film transistor DT. Further, for the gate driver IC GIP, the first thin film transistor T1 having the polycrystalline semiconductor material may be used. If required, for the gate driver IC GIP, the C-MOS type thin film transistor including P-MOS type and N-MOS type thin film transistors may be used.

While the embodiments of the present invention have been described in detail with reference to the drawings, it will be understood by those skilled in the art that the invention can be implemented in other specific forms without changing the technical principle or spirit, or essential features of the invention. Therefore, it should be noted that the forgoing embodiments are merely illustrative in all aspects and are not to be construed as limiting the invention. The scope of the invention is defined by the appended claims rather than the detailed description of the invention. All changes or modifications or their equivalents made within the meanings and scope of the claims should be construed as falling within the scope of the invention.

What is claimed is:

1. A display device, comprising:
   a substrate;
   a first gate insulating layer over the substrate;
   a first thin film transistor including:
      a first semiconductor layer including the polycrystalline semiconductor material on the substrate, and having a middle portion and two side portions,
      a first source area and a first drain area, each including the oxide semiconductor material and disposed on a respective one of the side portions of the first semiconductor layer, and
      a first gate electrode disposed on the first gate insulating layer and overlapping the middle portion of the first semiconductor layer; and
   a second thin film transistor having an oxide semiconductor material on the substrate.

2. The display device of claim 1, wherein the second thin film transistor includes:
   a second semiconductor layer including the oxide semiconductor material on the substrate, and having a middle portion, a second source area at one side of the middle portion, and a second drain area at the other side of the middle portion; and
   a second gate electrode on the first gate insulating layer and overlapping the middle portion of the second semiconductor layer.

3. The display device of claim 2, further comprising:
   an intermediate insulating layer on the first semiconductor layer, the second semiconductor layer, the first gate electrode, and the second gate electrode,
   wherein the first thin film transistor further includes a first source electrode and a first drain electrode on the intermediate insulating layer, and
   wherein the second thin film transistor further includes a second source electrode and a second drain electrode on the intermediate insulating layer.

4. The display device of claim 3, wherein the first source electrode is connected to the first source area via a first contact hole through the intermediate insulating layer,
   wherein the first drain electrode is connected to the first drain area via a second contact hole through the intermediate insulating layer,
   wherein the second source electrode is connected to the second source area via a third contact hole through the intermediate insulating layer, and
   wherein the second drain electrode is connected to the second drain area via a fourth contact hole through the intermediate insulating layer.

5. The display device of claim 1, further comprising:
   a first intermediate insulating layer on the first gate electrode and the first gate insulating layer; and
   a second gate insulating layer,
   wherein the second thin film transistor includes
      a second semiconductor layer including the oxide semiconductor material on the first intermediate insulating layer, and having a middle portion, a second source area at one side of the middle portion, and a drain area at the other side of the middle portion,
      a first gate electrode on the second gate insulating layer and overlapping the middle portion of the first semiconductor layer, the second gate insulating layer being on the second semiconductor layer.

6. The display device of claim 5, wherein the first source area and the first drain area are disposed on the first intermediate insulating later, and are each connected to the respective one of the side portions of the first semiconductor layer via a respective contact hole through the first intermediate insulating layer.

7. The display device of claim 5, further comprising:
   a second intermediate insulating layer on the first intermediate insulating layer, the second semiconductor layer, and the second gate electrode,
   wherein the first thin film transistor further includes a first source electrode and a first drain electrode on the second intermediate insulating layer, and
   wherein the second thin film transistor further includes a second source electrode and a second drain electrode on the second intermediate insulating layer.

8. The display device of claim 7, wherein the first source electrode is connected to the first source area via a first contact hole through the second intermediate insulating layer,
   wherein the first drain electrode is connected to the first drain area via a second contact hole through the second intermediate insulating layer,
   wherein the second source electrode is connected to the second source area via a third contact hole through the second intermediate insulating layer, and
   wherein the second drain electrode is connected to the second drain area via a fourth contact hole through the second intermediate insulating layer.

9. The display device of claim 1, further comprising:
   a driver circuit on the substrate; and
   at least one pixel area on the substrate,
   wherein one of the first thin film transistor and the second thin film transistor is disposed in the pixel area, and
   wherein the other of the first thin film transistor and the second thin film transistor is disposed in the driver circuit.

10. The display device of claim 9, further comprising data lines and gate lines on the substrate,
    wherein the driver circuit includes:
       a data driver configured to output a data voltage,
       a multiplexer configured to distribute the data voltage from the data driver to the data lines, and
       a gate driver configured to output a scan pulse to the gate lines, and
    wherein the first thin film transistor is disposed in one or both of the multiplexer and the gate driver.

11. The display device of claim 1, wherein the display device is an organic light emitting diode display and further comprises a plurality of pixels on the substrate, each pixel including an organic light emitting diode,
    wherein the second thin film transistor is a switching element for selecting one of the pixels, and wherein the first thin film transistor is a driving element for driving the organic light emitting diode of the pixel selected by the second thin film transistor.

12. A display device, comprising:
a substrate;
a first thin film transistor on the substrate, and including a source electrode and a first semiconductor layer having a polycrystalline semiconductor material; and
a second thin film transistor on the substrate, and including a drain electrode, and a second semiconductor layer having an oxide semiconductor material;
wherein the first semiconductor layer is directly connected to the second semiconductor layer, and
wherein the source electrode and the drain electrode are made of a same material and are disposed at a same layer level.

13. The display device of claim 12, further comprising a gate insulating layer on the first semiconductor layer and the second semiconductor layer,
wherein the first thin film transistor includes a first gate electrode on the gate insulating layer, and
wherein the second thin film transistor includes a second gate electrode on the gate insulating layer.

14. The display device of claim 13, wherein the first semiconductor layer includes a first channel area, a first source area at one side of the first channel area, and a first drain area of at the other side of the first channel area,
wherein the first gate electrode overlaps the first channel area,
wherein the second semiconductor layer includes a second channel area, a first side portion at one side of the second channel area, and a second side portion at the other side of the second channel area, and
wherein the second gate electrode overlaps the second channel area.

15. The display device of claim 14, further comprising an intermediate insulating layer on the first gate electrode and the second gate electrode,
wherein the source electrode is on the intermediate insulating layer and is connected to the first source area via a first contact hole through the intermediate insulating layer.

16. The display device of claim 15, wherein the second thin film transistor further includes a third semiconductor layer having the polycrystalline semiconductor material,
wherein the third semiconductor layer is connected directly to the second side portion of the second semiconductor layer to form a second drain area, and
wherein the drain electrode is on the intermediate insulating layer and is connected via a second contact hole through the intermediate insulating layer.

17. The display device of claim 14, wherein the drain area of the first semiconductor layer is directly connected to the first side portion of the second semiconductor layer to form a second source area.

18. The display device of claim 12, wherein the second thin film transistor further includes a portion of the first semiconductor layer.

19. The display device of claim 12, further comprising a driver circuit on the substrate,
wherein the first thin film transistor and the second thin film transistor are disposed in the driver circuit.

20. A display device, comprising:
a substrate;
a first thin film transistor on the substrate, and including a first semiconductor layer having a polycrystalline semiconductor material;
a second thin film transistor on the base substrate, and including a second semiconductor layer; and
an oxide semiconductor layer connecting the first semiconductor layer and the second semiconductor layer.

21. The display device of claim 20, wherein the second semiconductor layer has the polycrystalline semiconductor material.

22. The display device of claim 20, wherein the first semiconductor layer has a first channel area, a first source area at one side of the first channel area, and a first drain area at the other side of the first channel area, and
wherein the second semiconductor layer has a second channel area, a first side portion at one side of the second channel area, and a second side portion at the other side of the second channel area.

23. The display device of claim 22, wherein the second semiconductor layer includes an oxide semiconductor material, and
wherein the oxide semiconductor layer is the first side portion of the second semiconductor layer and is connected directly to the first drain area to form a second source area.

24. The display device of claim 22, wherein the first side portion is a second source area, and the second side portion is a second drain area, and
wherein the oxide semiconductor layer is directly connected to the first drain area and the second source area.

25. The display device of claim 24, further comprising a gate insulating layer on the first semiconductor layer and the second semiconductor layer,
wherein the first thin film transistor further includes a first gate electrode on the gate insulating later and overlapping the first channel area, and
wherein the second thin film transistor further includes a second gate electrode on the gate insulating layer and overlapping the second channel area.

26. The display device of claim 25, further comprising an intermediate insulating layer on the first gate electrode and the second gate electrode,
wherein the first thin film transistor further includes a source electrode on the intermediate insulating layer and connected to the first source area via a first contact hole through the intermediate insulating layer, and
wherein the second thin film transistor further includes a drain electrode on the intermediate insulating layer and connected to the second drain area via a second contact hole through the intermediate insulating layer.

27. The display device of claim 20, further comprising a driver circuit on the substrate,
wherein the first thin film transistor and the second thin film transistor are disposed in the driver circuit.

* * * * *